(12) United States Patent
Takahashi

(10) Patent No.: US 9,443,585 B2
(45) Date of Patent: *Sep. 13, 2016

(54) RESISTANCE CHANGE MEMORY

(71) Applicant: KABUSHIKI KAISHA TOSHIBA, Tokyo (JP)

(72) Inventor: Masahiro Takahashi, Seongnam-si (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/722,846

(22) Filed: May 27, 2015

(65) Prior Publication Data

US 2015/0269996 A1 Sep. 24, 2015

Related U.S. Application Data

(63) Continuation of application No. 14/201,664, filed on Mar. 7, 2014, now Pat. No. 9,070,440.

(60) Provisional application No. 61/870,099, filed on Aug. 26, 2013.

(51) Int. Cl.
G11C 7/00 (2006.01)
G11C 7/06 (2006.01)
G11C 29/00 (2006.01)
(Continued)

(52) U.S. Cl.
CPC .......... *G11C 13/0021* (2013.01); *G11C 5/148* (2013.01); *G11C 11/16* (2013.01); *G11C 13/004* (2013.01); *G11C 13/0004* (2013.01); *G11C 13/0007* (2013.01); *G11C 13/0038* (2013.01); *G11C 13/0069* (2013.01); *G11C 5/147* (2013.01); *G11C 7/00* (2013.01); *G11C 7/06* (2013.01); *G11C 7/14* (2013.01); *G11C 11/5678* (2013.01); *G11C 13/0002* (2013.01); *G11C 16/28* (2013.01); *G11C 29/021* (2013.01)

(58) Field of Classification Search
CPC ..... G11C 5/147; G11C 7/00; G11C 13/0004; G11C 13/0038; G11C 29/021; G11C 7/14; G11C 13/004; G11C 7/06; G11C 13/0002; G11C 16/28; G11C 11/5678; G11C 2013/0054; G11C 13/0007; G11C 2013/0045
USPC ........ 365/51, 63, 72, 148, 163, 158, 189.09, 365/189.15, 205
See application file for complete search history.

(56) References Cited

U.S. PATENT DOCUMENTS 7,791,930 B2    9/2010  Ueda
9,070,440 B2 *  6/2015  Takahashi .......... G11C 13/0069
(Continued)

Primary Examiner — Ly D Pham
(74) Attorney, Agent, or Firm — Holtz, Holtz & Volek PC

(57) ABSTRACT

According to one embodiment, a resistance change memory includes a first memory cell, a word line, a first bit line, first and second inverters, first to sixth MOS transistors, and a control circuit. The first transistor is connected to the first output terminal of the first inverter. The second transistor is connected to the second output terminal of the second inverter. The fifth transistor has a first current path whose one end is connected to the first voltage terminal of the first inverter. The sixth transistor has a second current path whose one end is connected to the third voltage terminal of the second inverter. The control circuit makes the first and second transistors a cutoff state by a first signal and makes the fifth and sixth transistors the cutoff state by a second signal in a standby state.

4 Claims, 20 Drawing Sheets

(51) Int. Cl.

| | | |
|---|---|---|
| *G11C 7/08* | (2006.01) | |
| *G11C 5/06* | (2006.01) | |
| *G11C 7/14* | (2006.01) | |
| *G11C 7/22* | (2006.01) | |
| *G11C 13/00* | (2006.01) | |
| *G11C 11/16* | (2006.01) | |
| *G11C 5/14* | (2006.01) | |
| *G11C 29/02* | (2006.01) | |
| *G11C 16/28* | (2006.01) | |
| *G11C 11/56* | (2006.01) | |

(56) References Cited

U.S. PATENT DOCUMENTS

2007/0253237 A1  11/2007  Tsuchida
2010/0054020 A1  3/2010  Ueda
2011/0051498 A1  3/2011  Shimotori

* cited by examiner

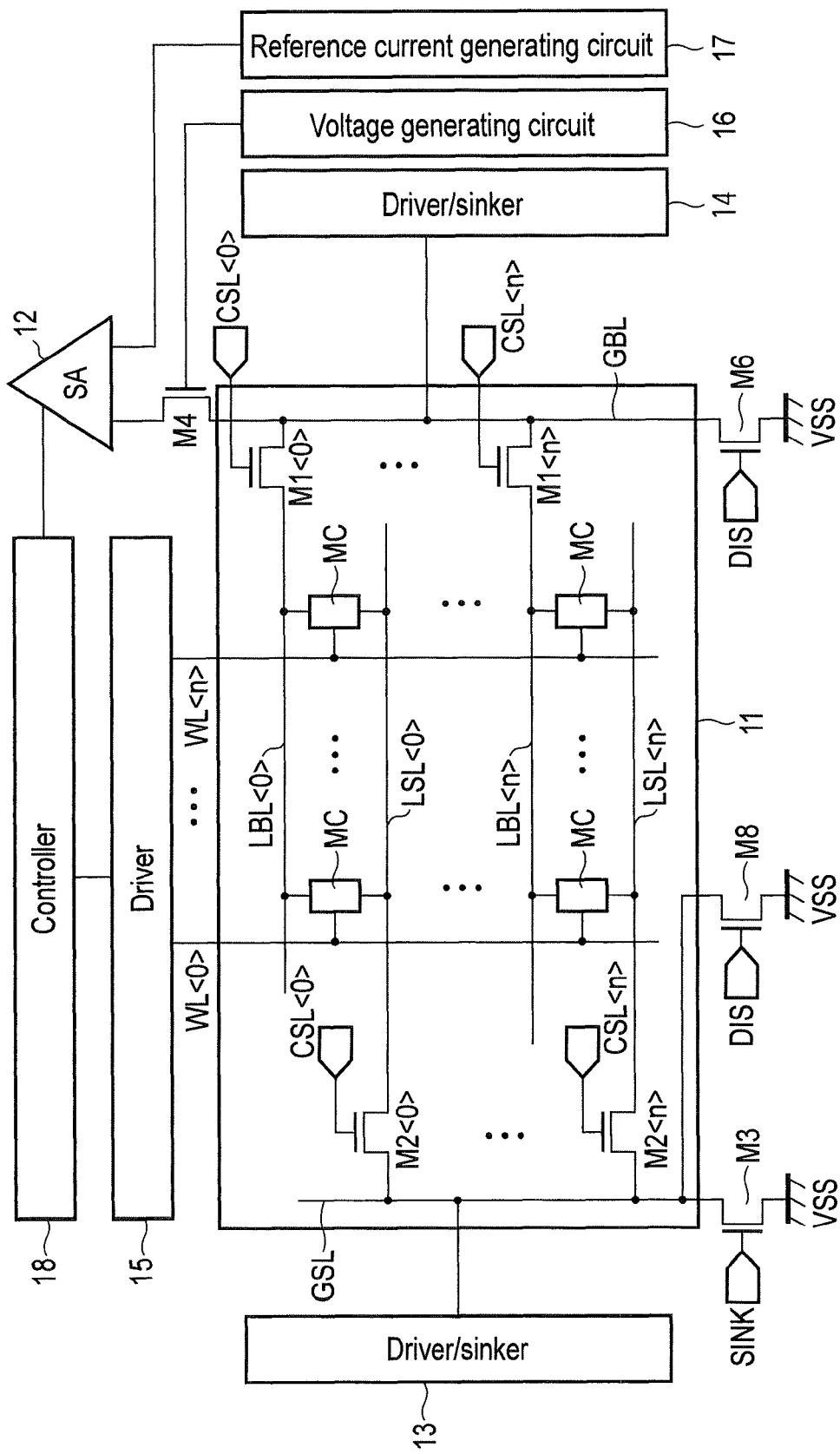
F I G. 1

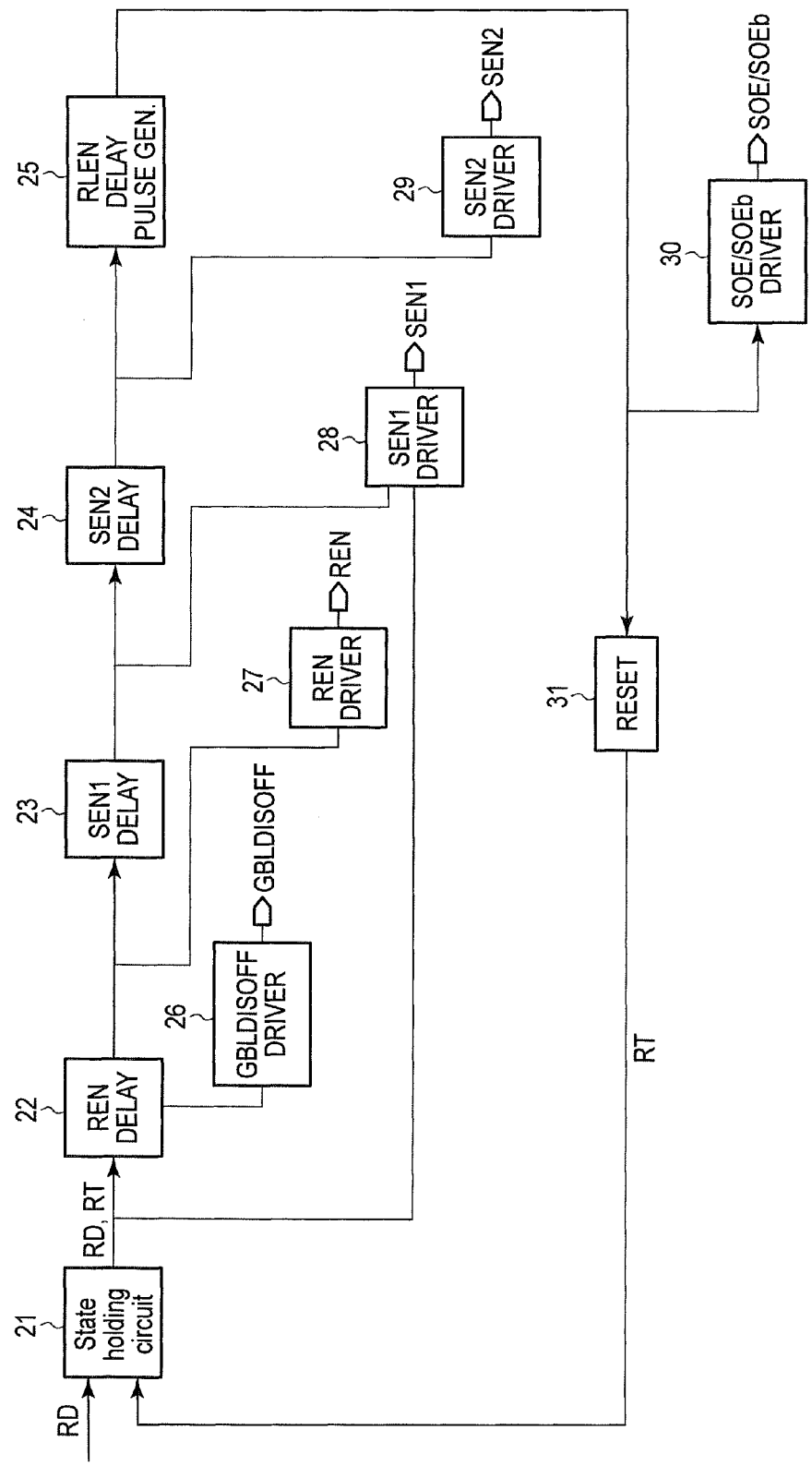
F I G. 3

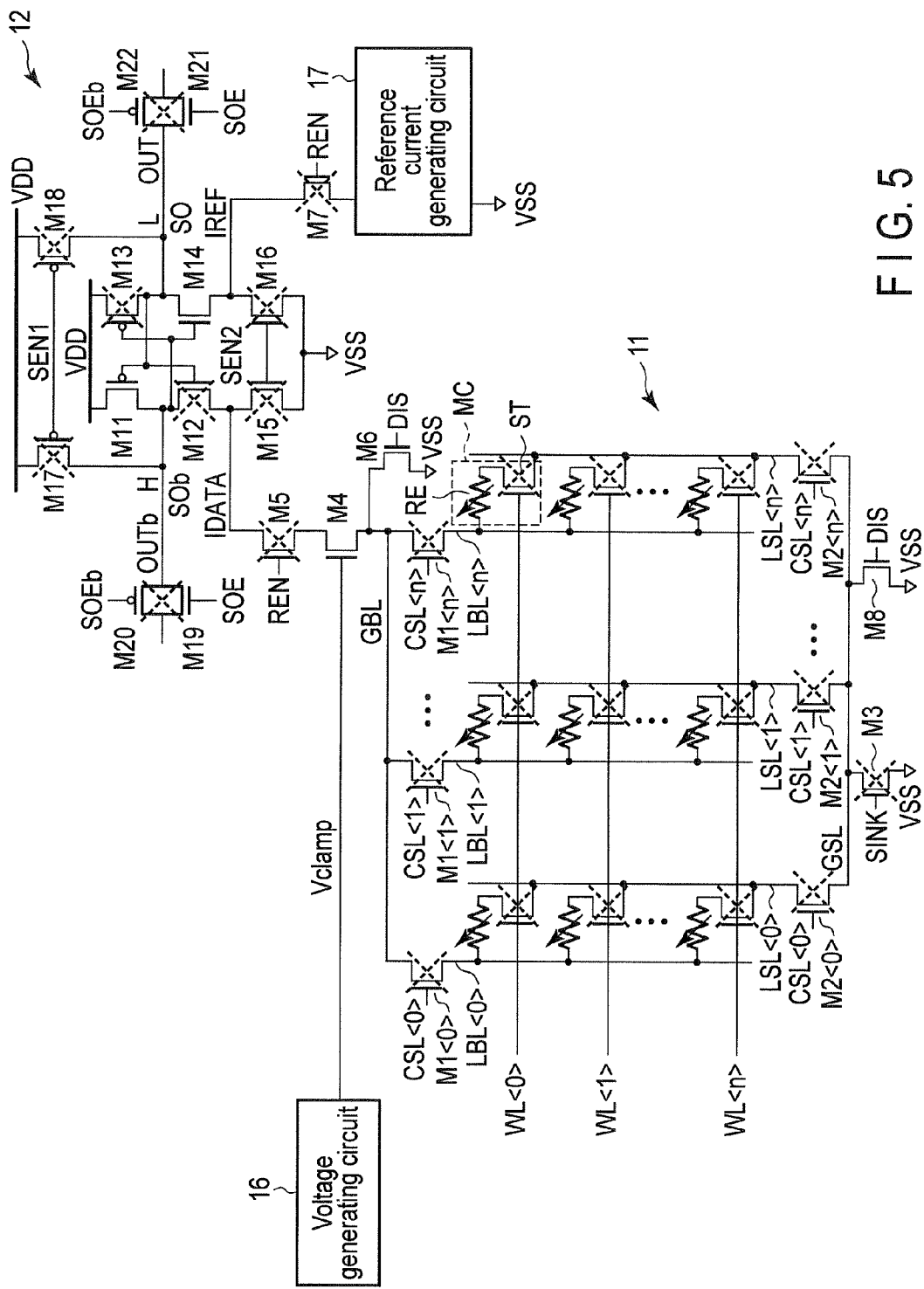
F I G. 5

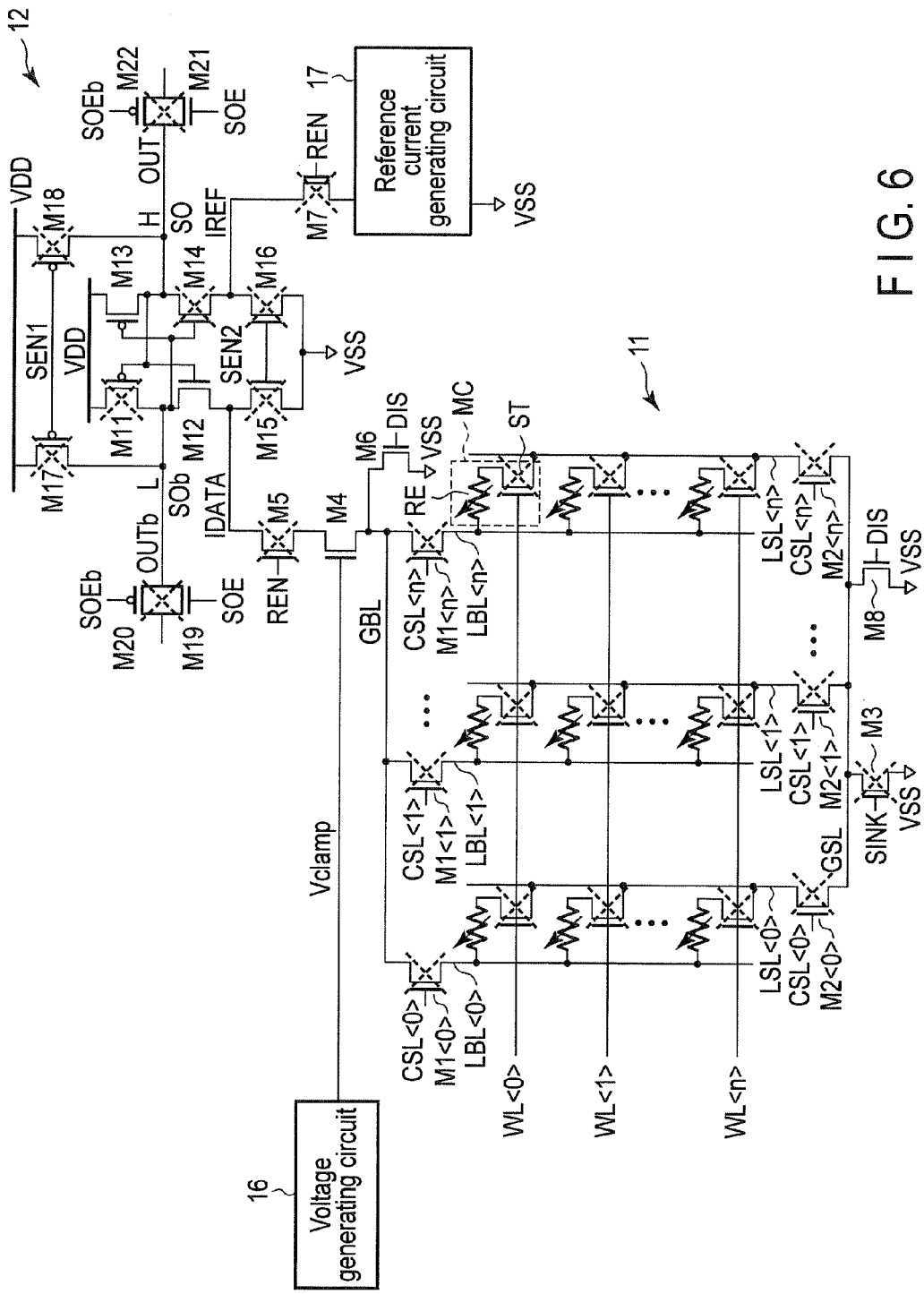
F I G. 6

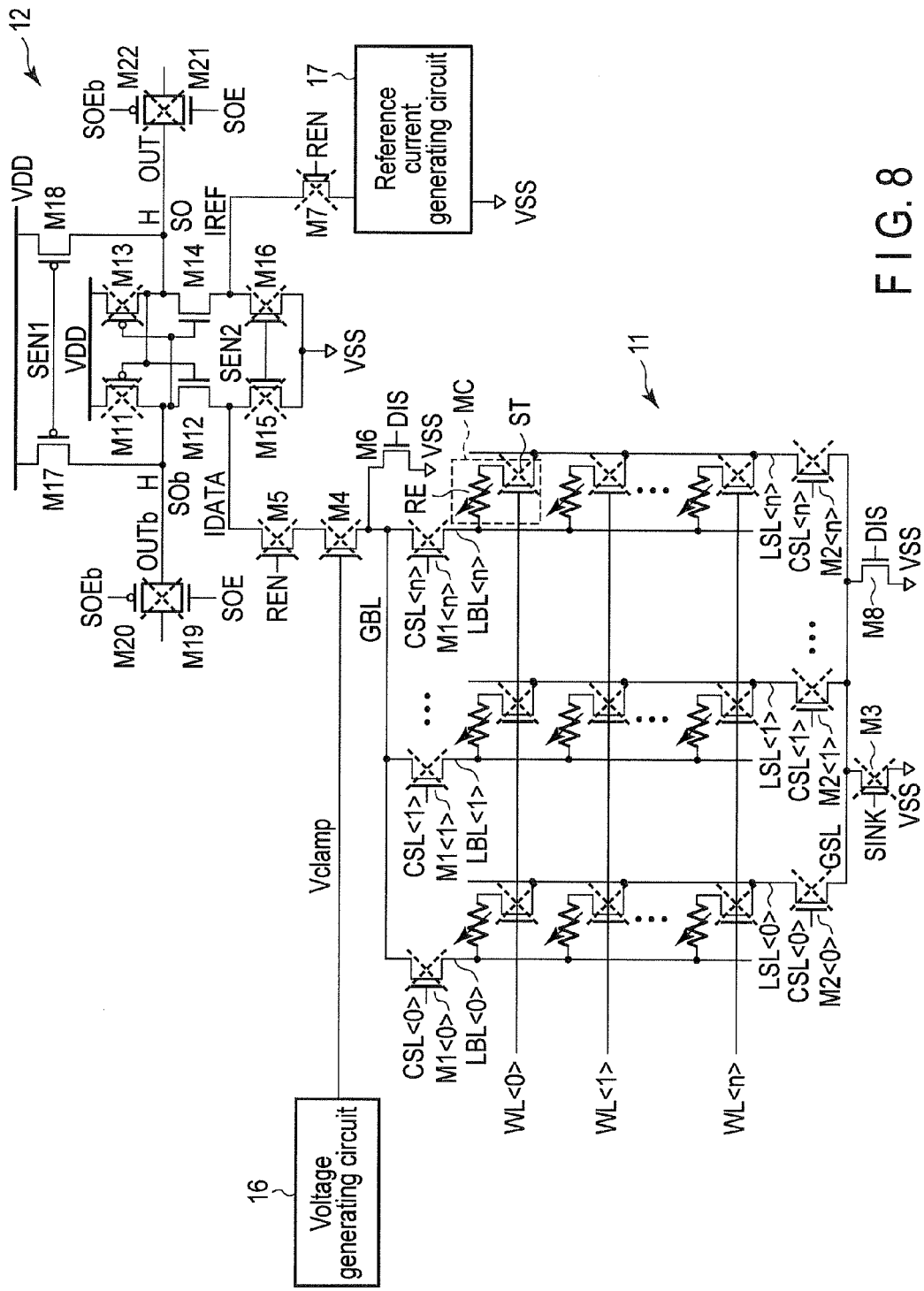
F I G. 8

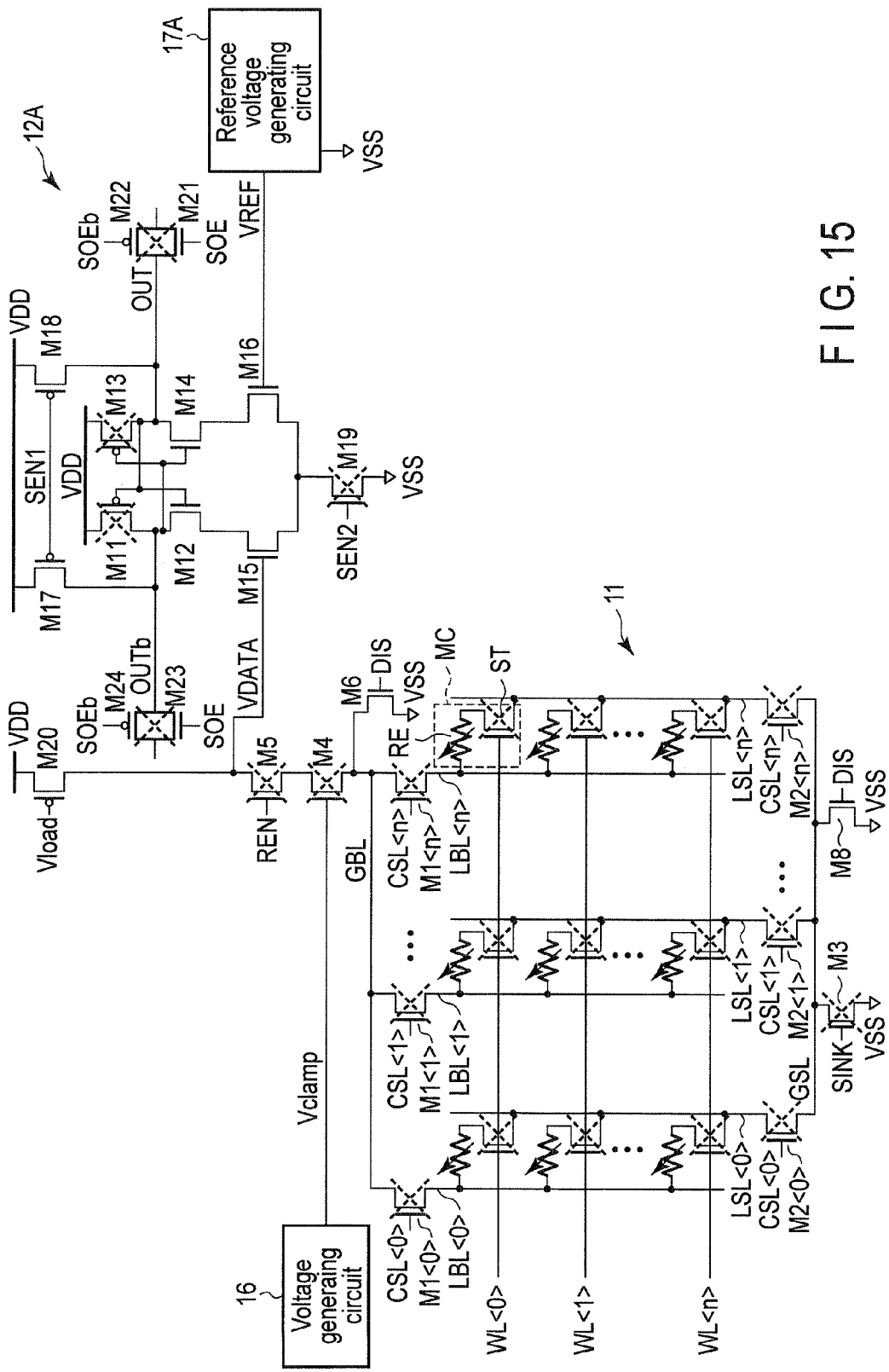
F I G. 15

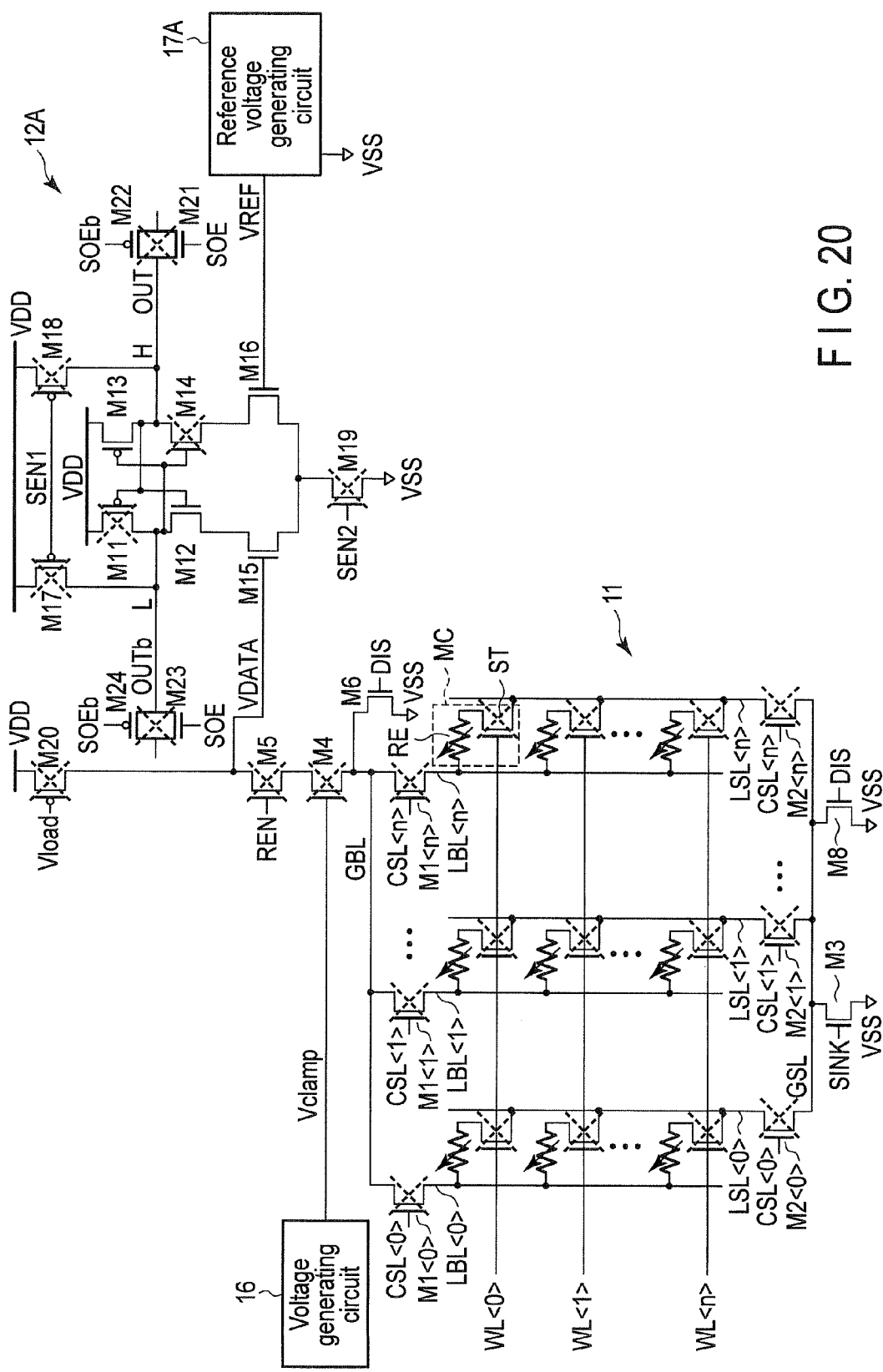
F I G. 20

RESISTANCE CHANGE MEMORY

CROSS-REFERENCE TO RELATED APPLICATIONS

This application is a Continuation application of U.S. Ser. No. 14/201,664, filed Mar. 7, 2014, which claims the benefit of U.S. Provisional Application No. 61/870,099, filed Aug. 26, 2013, the entire contents of which are incorporated herein by reference.

FIELD

Embodiments described herein relate generally to a resistance change memory.

BACKGROUND

In recent years, semiconductor memories using a non-volatile memory, for example, a resistance change memory (magnetoresistive random access memory: MRAM, phase change random access memory: PRAM, resistive random access memory: ReRAM and the like) as a memory device attract attention.

In a resistance change memory, "1" or "0" data is determined by using the fact that the value of resistance is changed by applying a current (or a voltage). Thus, the resistance change memory includes a sense amplifier that senses a minute current difference or voltage difference of a read current read from a memory cell.

BRIEF DESCRIPTION OF THE DRAWING

FIG. 1 is a diagram showing a configuration of a resistance change memory according to a first embodiment;

FIG. 3 is a block diagram of a circuit that generates each signal of a read and a read reset in the resistance change memory according to the first embodiment;

FIGS. 5 and 6 are circuit diagrams showing states of transistors during standby of the resistance change memory according to the first embodiment;

FIG. 8 is a circuit diagram showing the states of transistors during standby of the resistance change memory according to the second embodiment;

FIG. 15 is a circuit diagram showing the states of transistors during standby of the resistance change memory according to a fifth embodiment;

FIGS. 19 and 20 are circuit diagrams showing the states of transistors during standby of the resistance change memory according to the seventh embodiment.

DETAILED DESCRIPTION

Figure 2:
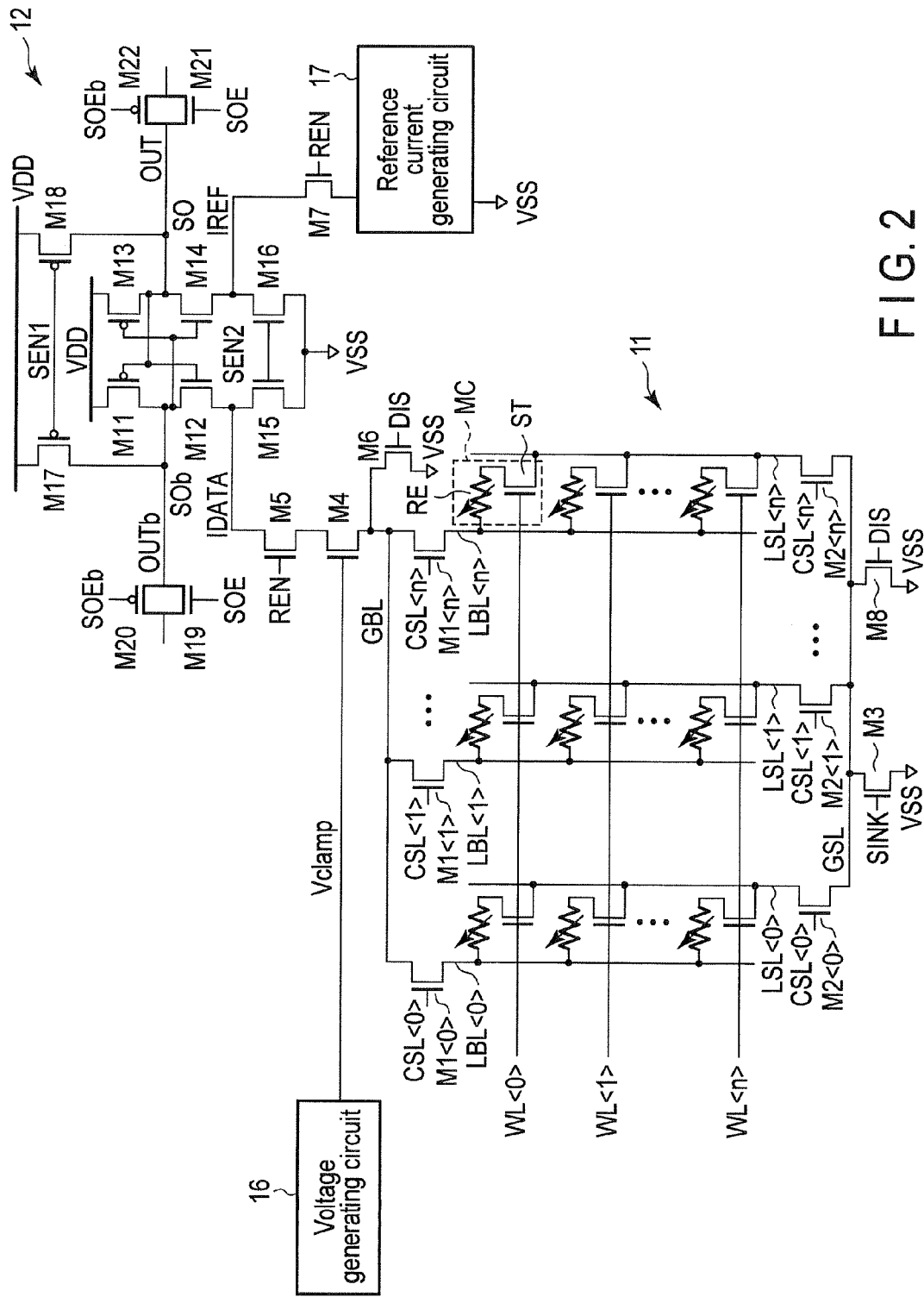
FIG. 2 is a circuit diagram showing the configuration of principal components of the resistance change memory according to the first embodiment.

Resistance change memories according to the embodiments will be described below with reference to the drawings. In the description that follows, the same reference numerals are attached to elements having the same function and configuration and a duplicate description will be provided only when necessary. In addition, each embodiment shown below illustrates an apparatus or method that embodies a technical idea of the embodiment and does not identify materials, shapes, structures, arrangement and the like of components.

In general, according to one embodiment, a resistance change memory includes a first memory cell, a word line, a first bit line, first and second inverters, first to sixth MOS transistors, and a control circuit. The first memory cell includes a resistance change element. The word line is connected to the first memory cell and is driven based on an address signal. The first bit line is connected to the first memory cell, is crossing the word line, and is selected based on the address signal. The first inverter includes a first input terminal, a first output terminal, and first and second voltage terminals. The second inverter includes a second input terminal, a second output terminal, and third and fourth voltage terminals. The second input terminal is connected to the first output terminal and the second output terminal is connected to the first input terminal. The first MOS transistor is connected to the first output terminal. The first signal is supplied to a gate of the first MOS transistor. The second MOS transistor is connected to the second output terminal. The first signal is supplied to a gate of the second MOS transistor. The third MOS transistor is connected to the first voltage terminal. The fourth MOS transistor is connected to the third voltage terminal. The fifth MOS transistor has a first current path whose one end is connected to the first voltage terminal. The current flowing to the first bit line is supplied to the other end of the first current path and a second signal is supplied to a gate of the fifth MOS transistor. The sixth MOS transistor has a second current path whose one end is connected to the third voltage terminal. The reference current is supplied to the other end of the second current path and the second signal is supplied to a gate of the sixth MOS transistor. The control circuit generates the first and second signals. The control circuit makes the first and second MOS transistors a cutoff state by the first signal and makes the fifth and sixth MOS transistors the cutoff state by the second signal in a standby state.

[First Embodiment]

FIG. 1 is a diagram showing the configuration of a resistance change memory according to the first embodiment.

The resistance change memory includes a memory cell array 11, a sense amplifier 12, drivers/sinkers 13, 14, a driver 15, a voltage generating circuit 16, a reference current generating circuit 17, and a controller 18.

The memory cell array 11 has a plurality of memory cells MC arranged in a matrix shape. Memory cells are connected to between a local bit line LBL<0> and a local source line LSL<0>, between LBL<1> and LSL1<1>, . . . , between LBL<n> and LSL<n>. Further, memory cells are connected to respective word lines WL<0> to WL<n>. That is, memory cells are arranged in positions where the local bit lines LBL<0> to LBL<n> and the local source lines LSL<0> to LSL<n>, and the word lines WL<0> to WL<n> cross. n represents any of 0, 1, 2, . . . , n.

One ends of the local bit lines LBL<0> to LBL<n> are connected to a global bit line GBL via respective n-channel MOS field effect transistors (hereinafter, abbreviated as nMOS transistors) M1<0> to M1<n>. Column selection signals CSL<0> to CSL<n> are supplied to the gates of the nMOS transistors M1<0> to M1<n> respectively. The other ends of the local bit lines LBL<0> to LBL<n> are connected to the plurality of memory cells MC.

The global bit line GBL is connected to the driver/sinker 14. The global bit line GBL is also connected to the sense amplifier 12 via an nMOS transistor (clamp transistor) M4. The voltage generating circuit 16 that generates a predetermined voltage is connected to the gate of the nMOS transistor M4. The global bit line GBL is also connected to a reference voltage terminal, for example, a ground potential terminal Vss via an nMOS transistor (discharge transistor) M6. A discharge signal DIS is supplied to the gate of the nMOS transistor M6.

One ends of the local source lines LSL<0> to LSL<n> are connected to a global source lines GSL via nMOS transistors M2<0> to M2<n>, respectively. The column selection signals CSL<0> to CSL<n> are supplied to the gates of the nMOS transistors M2<0> to M2<n>, respectively. The other ends of the local source lines LSL<0> to LSL<n> are connected to the plurality of memory cells MC.

The global source line GSL is connected to the driver/sinker 13. The global source line GSL is also connected to the reference voltage terminal, for example, the ground potential terminal Vss via an nMOS transistor M3. A signal SINK is supplied to the gate of the nMOS transistor M3. The global source line GSL is also connected to the reference voltage terminal, for example, the ground potential terminal Vss via an nMOS transistor (discharge transistor) M8. The discharge signal DIS is supplied to the gate of the nMOS transistor M8.

The drivers/sinkers 13, 14 pass a write current oriented in accordance with write data to the memory cells MC during writing. The drivers/sinkers 13, 14 thereby write data into the memory cells MC.

The word lines WL<0> to WL<n> are connected to the driver 15 that drives the word lines.

The reference current generating circuit 17 that supplies a reference current to the sense amplifier 12 is connected to the sense amplifier 12. In addition, the controller 18 is connected to the sense amplifier 12. The controller 18 controls the operation of each module in the resistance change memory. For example, the controller 18 generates a control signal supplied to the sense amplifier 12 to control standby and read operations of the sense amplifier 12.

FIG. 2 is a circuit diagram showing the configuration of the memory cell array 11 and the sense amplifier 12 in FIG. 1.

The configuration of the memory cell array 11 will be described.

The memory cell array 11 includes, as described above, a plurality of memory cells arranged in a matrix shape in positions where the local bit lines LBL<0> to LBL<n> and the local source lines LSL<0> to LSL<n>, and the word lines WL<0> to WL<n> cross. n represents any of 0, 1, 2, . . . , n.

The memory cell MC contains, for example, a resistance change element RE and a select transistor ST. The resistance change element RE is an element whose resistance is changed by applying at least one of a current (and a voltage). The resistance change element RE contains, for example, an MTJ (magnetic tunnel junction) element, variable resistance element, phase change element, or ferroelectric element. The gate of the select transistor ST is connected to the word line WL. The memory cell MC is selected by the select transistor ST being turned on by the word line WL.

One ends of the local bit lines LBL<0> to LBL<n> are connected to the global bit line GBL via column selection transistors M1<0> to M1<n>, respectively. The column selection signals CSL<0> to CSL<n> are supplied to the gates of the column selection transistors M1<0> to M1<n>, respectively.

Further, the global bit line GBL is connected to a connection node between nMOS transistors M12, M15 in the sense amplifier 12 via the clamp transistor M4 and an nMOS transistor (read enable transistor) M5 whose current paths are connected in series. The global bit line GBL is also connected to the ground potential terminal Vss via the nMOS transistor M6. The discharge signal DIS is supplied to the gate of the nMOS transistor M6.

One ends of the local source lines LSL<0> to LSL<n> are connected to the global source lines GSL via column selection transistors M2<0> to M2<n>, respectively. The column selection signals CSL<0> to CSL<n> are supplied to the gates of the column selection transistors M2<0> to M2<n>, respectively.

The global source line GSL is connected to the ground potential terminal Vss via the nMOS transistor M3. The signal SINK is supplied to the gate of the nMOS transistor M3. The global source line GSL is also connected to the ground potential terminal Vss via the nMOS transistor M8. The discharge signal DIS is supplied to the gate of the nMOS transistor M8.

The configuration of the sense amplifier 12 will be described below.

The sense amplifier 12 is a current detection sense amplifier. The sense amplifier 12 includes a first inverter, a second inverter, nMOS transistors M15, M16, p-channel MOS field effect transistors (hereinafter, abbreviated as pMOS transistors) M17, M18, a first path transistor, and a second path transistor.

The first inverter contains a pMOS transistor M11 and the nMOS transistor M12. The first inverter has a first input terminal, a first output terminal, and first and second voltage terminals. The second inverter contains a pMOS transistor M13 and an nMOS transistor M14. The second inverter has a second input terminal, a second output terminal, and third and fourth voltage terminals. The second input terminal is connected to the first output terminal and the second output terminal is connected to the first input terminal.

The first path transistor contains an nMOS transistor M19 and a pMOS transistor M20. The second path transistor contains an nMOS transistor M21 and a pMOS transistor M22.

A drain of a pMOS transistor (sense enable transistor) M17 is connected to the first output terminal of the first inverter and a source of the pMOS transistor M17 is connected to a power supply voltage terminal VDD. The drain of a pMOS transistor (sense enable transistor) M18 is connected to the second output terminal of the second inverter and the source of the pMOS transistor M18 is connected to the power supply voltage terminal VDD. A sense enable signal SEN1 is supplied from the controller 18 to the gates of the nMOS transistors M17, M18.

The drain of the nMOS transistor M15 is connected to the first voltage terminal (source of the transistor M12) of the first inverter and the source of the nMOS transistor M15 is connected to the ground potential terminal Vss. The drain of the nMOS transistor M16 is connected to the third voltage terminal (source of the transistor M14) of the second inverter and the source of the nMOS transistor M16 is connected to the ground potential terminal Vss. A sense enable signal SEN2 is supplied from the controller 18 to the gates of the nMOS transistors M15, M16.

The first path transistor (transistors M19, M20) is connected to the first output terminal of the first inverter. Output enable signals SOE, SOEb are supplied from the controller 18 to the gates of the transistors M19, M20, respectively.

The second path transistor (transistors M21, M22) is connected to the second output terminal of the second inverter. The output enable signals SOE, SOEb are supplied from the controller 18 to the gates of the transistors M21, M22 respectively.

The first voltage terminal (source of the transistor M12) of the first inverter is connected to the drain of the nMOS transistor M5. A read enable signal REN is supplied from the controller 18 to the gate of the nMOS transistor M5. The source of the nMOS transistor M5 is connected to the global bit line GBL via the nMOS transistor M4. The voltage generating circuit 16 is connected to the gate of the nMOS transistor M4.

The third voltage terminal (source of the transistor M14) of the second inverter is connected to the reference current generating circuit 17 via an nMOS transistor (read enable transistor) M7. The read enable signal REN is supplied from the controller 18 to the gate of the nMOS transistor M7.

The voltage generating circuit 16 is connected to the gate of the nMOS transistor M4. The voltage generating circuit 16 supplies a clamp voltage Vclamp (for example, 0.1 to 0.6 V) as a predetermined analog voltage to the gate of the clamp transistor M4 when reading. The current flowing to the selected memory cell MC is restricted in such a way that the upper limit thereof is not exceeded in order to prevent damage of data stored in the selected memory cell. The voltage generating circuit 16 also can change the clamp transistor M4 to an off state (cutoff state) by supplying the voltage Vclamp ("Low") to the gate of the clamp transistor M4 during standby.

Next, the standby and read in a resistance change memory according to the first embodiment will be described.

FIG. 3 shows a generating circuit that generates each signal of a read and a read reset in the resistance change memory. The transition of the resistance change memory from a reading state to a standby state is caused by the read reset after reading. The generating circuit is formed, for example, in the controller 18.

The generating circuit shown in FIG. 3 includes a state holding circuit 21, a read delay circuit 22, a sense delay circuit 23, a sense delay circuit 24, a read delay pulse generator 25, a discharge driver 26, a read driver 27, a sense driver 28, a sense driver 29, an output driver 30, and a reset circuit 31.

The generating circuit operates when reading as described below.

A read signal RD is input into the state holding circuit 21. The state holding circuit 21 is formed of, for example, a flip-flop and stores the read signal. Then, the state holding circuit 21 outputs the read signal RD.

The read signal RD output from the state holding circuit 21 is first input into the sense driver 28. When the read signal RD is received, the sense driver 28 outputs the sense enable signal SEN1. At this point, the sense enable signal SEN1 is an active signal ("Low").

The read signal RD output from the state holding circuit 21 is also input into the read delay circuit 22 and delayed before being output from the read delay circuit 22 to the discharge driver 26 and the read driver 27. When the read signal RD is received, the discharge driver 26 outputs the discharge signal DIS. At this point, the discharge signal DIS is an inactive signal ("Low"). When the read signal RD is received, the read driver 27 outputs the read enable signal REN. At this point, the read enable signal REN is an active signal ("High").

Further, the read signal RD output from the read delay circuit 22 is input into the sense delay circuit 23. Then, the read signal RD is delayed by the sense delay circuit 23 before being output to the sense driver 28. When the read signal RD is received from the sense delay circuit 23, the sense driver 28 outputs the sense enable signal SEN1. At this point, the sense enable signal SEN1 is an inactive signal ("High").

Further, the read signal RD output from the sense delay circuit 23 is input into the sense delay circuit 24. Then, the read signal RD is delayed by the sense delay circuit 24 before being output to the sense driver 29. When the read signal RD is received from the sense delay circuit 24, the sense driver 29 outputs the sense enable signal SEN2. At this point, the sense enable signal SEN2 is an active signal ("High").

The read signal output from the sense delay circuit 24 is input into the read delay pulse generator 25. Further, the read signal output from the read delay pulse generator 25 is input into the output driver 30. When the read signal is received, the output driver 30 outputs the output enable signals SOE, SOEb.

The sense amplifier 12 and the memory cell array 11 receive the aforementioned sense enable signal SEN1, discharge signal DIS, read enable signal REN, sense enable signal SEN1, sense enable signal SEN2, and output enable signals SOE, SOEb one after another from the controller 18 to perform the read operation.

The generating circuit shown in FIG. 3 operates as shown below in the read reset that terminates the read after the read operation. The transition of the resistance change memory from the reading state to the standby state is caused by the read reset.

The read signal output from the read delay pulse generator 25 is, for example, a signal having a pulse waveform and is input into the reset circuit 31. When the read signal in a pulse waveform is received, the reset circuit 31 outputs a reset signal RT to the state holding circuit 21 by using a falling edge. When the reset signal RT is received, the state holding circuit 21 stores that the generating circuit is in a reset state. Then, the state holding circuit 21 outputs the reset signal RT.

The reset signal RT output from the state holding circuit 21 is input into the read delay circuit 22. Then, the reset signal is output from the read delay circuit 22 to the discharge driver 26 and the read driver 27. When the reset signal RT is received, the discharge driver 26 outputs the discharge signal DIS. At this point, the discharge signal DIS is an active signal ("High"). When the reset signal RT is received, the read driver 27 outputs the read enable signal REN. At this point, the read enable signal REN is an inactive signal ("Low").

Further, the reset signal output from the read delay circuit 22 is input into the sense delay circuit 24 via the sense delay circuit 23. Then, the reset signal is output from the sense delay circuit 24 to the sense driver 29. When the reset signal is received, the sense driver 29 outputs the sense enable signal SEN2. At this point, the sense enable signal SEN2 is an inactive signal ("Low").

The sense amplifier 12 and the memory cell array 11 receive the aforementioned discharge signal DIS, read enable signal REN, and sense enable signal SEN2 one after another from the controller 18 to perform the read reset after the read operation. The transition of the resistance change memory from the reading state to the standby state is caused by the read reset.

Figure 4:
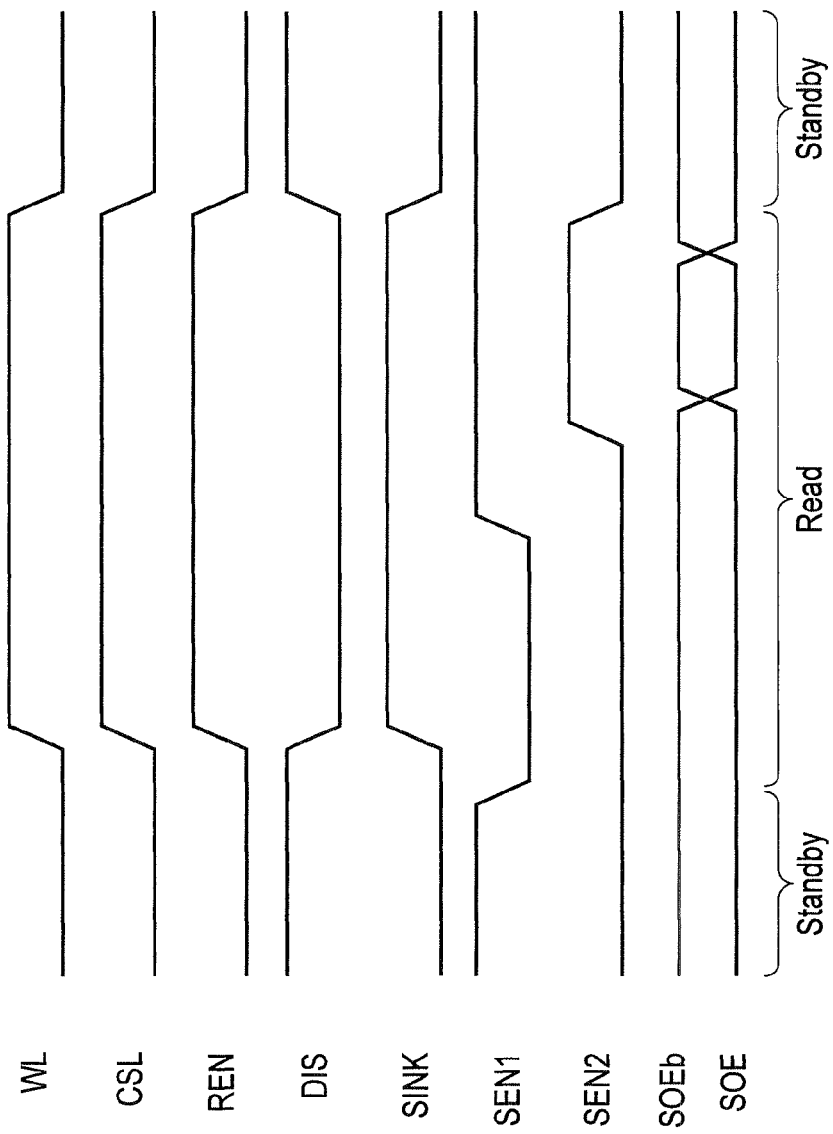
FIG. 4 is a timing chart of each signal during standby or when reading in the resistance change memory according to the first embodiment.

FIG. 4 is a timing chart of each signal during standby or when reading in the resistance change memory according to the first embodiment.

Each signal in the standby state before reading is started and the operation thereof are as follows.

The read enable signal REN is "Low" and the read enable transistors M5, M7 are thereby in an off state. The sense enable signal SEN1 is "High" and the sense enable transistors M17, M18 are thereby in an off state. The discharge signal DIS is "High" and the discharge transistors M6, M8 are thereby in an on state.

The word line WL, the column selection signal CSL<n>, the signal SINK, the sense enable signal SEN2, and the signal SOE are "Low" and the signal SOEb is "High". MOS transistors connected to these signals are thereby in an off state.

Each signal and the operation thereof when reading are as follows.

In the sense amplifier 12, the sense enable signal SEN1 becomes "Low" as the initial state and a node SO and a node SOb are precharged at the power supply voltage VDD. The analog voltage Vclamp is supplied to the clamp transistor M4 and the clamp transistor M4 is in an on state.

In the memory cell array 11, the column selection signal CSL<n> becomes "High" and the local bit line LBL<n> and the local source line LSL<n> are selected. Further, the word line WL<n> is driven and the memory cell MC to be read is selected. The discharge signal DIS becomes "Low" and the discharge transistors M6, M8 are turned off. The signal SINK becomes "High" and the sink transistor M3 is turned on. The timing of turning on the sink transistor M3 may be any timing before a read current is passed to the memory cell MC.

In addition, the read enable signal REN becomes "High" and the read enable transistors M5, M7 are turned on. Accordingly, a read current flows from the sense amplifier 12 to the selected memory cell MC.

Next, the sense enable signal SEN1 becomes "High" and the sense enable transistors M17, M18 are turned off. Accordingly, precharging of the node SO and the node SOb is stopped. As a result, the read current becomes a current supplied only from the power supply voltage terminal VDD connected to the drains of the nMOS transistors M11, M13. At this point, the read current changes in accordance with data ("0" or "1") stored in the selected memory cell MC.

That is, the read current changes depending on whether the selected memory cell is in a low-resistance state or a high-resistance state. The read current that changes in accordance with data of the selected memory cell as described above will be written as a cell current IDATA.

Then, the sense enable signal SEN2 becomes "High" and the sense enable transistors M15, M16 are turned on. Accordingly, a reference current IREF passed by the reference current generating circuit 17 and the cell current IDATA are compared and "High" or "Low" is held in a latch circuit including the pMOS transistors M11, M13 and the nMOS transistors M12, M14 in accordance with the comparison result. The reference current IREF is set to an intermediate value between the cell current of a memory cell storing "0" and the cell current of a memory cell storing "1". The reference current IREF is generated by, for example, a reference memory cell.

Lastly, the output enable signal SOE becomes "High" and the output enable signal SOEb becomes "Low" and the nMOS transistors M19, M21 and the pMOS transistors M20, M22 are turned on. Accordingly, "High" or "Low" held in the latch circuit is output as output signals OUT, OUTb from the nodes SO, SOb respectively.

Each signal in the standby state after reading is completed and the operation thereof are as follows.

The read enable signal REN becomes "Low" and the read enable transistors M5, M7 are thereby in an off state. The sense enable signal SEN1 is maintained at "High" and the sense enable transistors M17, M18 are thereby in an off state. The discharge signal DIS becomes "High" and the discharge transistors M6, M8 are thereby in an on state.

The word line WL, the column selection signal CSL<n>, the signal SINK, the sense enable signal SEN2, and the signal SOE become "Low" and the signal SOEb becomes "High". MOS transistors connected to these signals are thereby in an off state.

In the first embodiment, as shown in FIG. 4, the read enable signal REN becomes "Low" during standby and the nMOS transistors M5, M7 change thereby to an off state. Further, the sense enable signal SEN1 becomes "High" and the pMOS transistors M17, M18 thereby change to an off state. Accordingly, in the sense amplifier 12, at least two transistors in an off state that interrupt a current can be arranged in series on a path on which a leak current flows between the power supply voltage terminal VDD and the ground potential terminal Vss (hereinafter, called a leak path). As a result, a leak current during standby can be decreased.

That a leak current during standby can be decreased will be described in detail using FIGS. 5 and 6. FIGS. 5 and 6 are circuit diagrams showing states of transistors during standby of the resistance change memory according to the first embodiment. Transistors in an off state are indicated by an X mark of a broken line.

If data of the memory cell read in reading before the transition to the standby state is "1", as shown in FIG. 5, an output signal OUTb is held at "High" and an output signal OUT is held at "Low".

In this case, the sense enable transistor M17, the nMOS transistor M12, and the sense enable transistor M15 are in an off state on a leak path (hereinafter, written as a leak path 1) formed in the order of the power supply voltage terminal VDD, the sense enable transistor M17, the nMOS transistor M12, the sense enable transistor M15, and the ground potential terminal Vss. Thus, three MOS transistors in an off state are present on the leak path 1.

In this case, the sense enable transistor M17, the nMOS transistor M12, and the read enable transistor M5 are in an off state on a leak path (hereinafter, written as a leak path 2) formed in the order of the power supply voltage terminal VDD, the sense enable transistor M17, the nMOS transistor M12, the read enable transistor M5, the clamp transistor M4, the discharge transistor M6, and the ground potential terminal Vss. Thus, three MOS transistors in an off state are present on the leak path 2.

The sense enable transistors M18, M16 are in an off state on a leak path (hereinafter, written as a leak path 3) formed in the order of the power supply voltage terminal VDD, the sense enable transistor M18, the nMOS transistor M14, the sense enable transistor M16, and the ground potential terminal Vss. Thus, two MOS transistors in an off state are present on the leak path 3.

The sense enable transistor M18 and the read enable transistor M7 are in an off state on a leak path (hereinafter, written as a leak path 4) formed in the order of the power supply voltage terminal VDD, the sense enable transistor M18, the nMOS transistor M14, the read enable transistor M7, and the ground potential terminal Vss. Thus, two MOS transistors in an off state are present on the leak path 4.

Thus, even if read data before the transition to the standby state is "1", at least two transistors in an off state can be arranged on a leak path between the power supply voltage terminal VDD and the ground potential terminal Vss during standby after the transition. A leak current can thereby be decreased.

If data of the memory cell read in reading before the transition to the standby state is "0", as shown in FIG. 6, the output signal OUTb is held at "Low" and the output signal OUT is held at "High".

In this case, the sense enable transistors M17, M15 are in an off state on the leak path 1. Thus, two MOS transistors in an off state are present on the leak path 1.

The sense enable transistor M17 and the read enable transistor M5 are in an off state on the leak path 2. Thus, two MOS transistors in an off state are present on the leak path 2.

The sense enable transistor M18, the nMOS transistor M14, and the sense enable transistor M16 are in an off state on the leak path 3. Thus, three MOS transistors in an off state are present on the leak path 3.

The sense enable transistor M18, the nMOS transistor M14, and the read enable transistor M7 are in an off state on the leak path 4. Thus, three MOS transistors in an off state are present on the leak path 4.

Thus, even if read data before the transition to the standby state is "0", at least two transistors in an off state can be arranged on a leak path between the power supply voltage terminal VDD and the ground potential terminal Vss during standby after the transition. A leak current can thereby be decreased.

In the first embodiment, as described above, at least two transistors in an off state can be arranged, as shown in FIGS. 5 and 6, on a leak path between the power supply voltage terminal VDD and the ground potential terminal Vss by using a standby and read sequence shown in FIG. 4. Accordingly, a leak current during standby can be decreased and power consumption can thereby be reduced.

[Second Embodiment]

In the second embodiment, an example in which a clamp transistor M4 and a read enable transistor M5 are made to be in an off state during standby will be described. The configuration of a resistance change memory, a memory cell array, and the configuration of a sense amplifier in the second embodiment are the same as those in the first embodiment shown in FIGS. 1 and 2 and thus, the description thereof is omitted.

Figure 7:
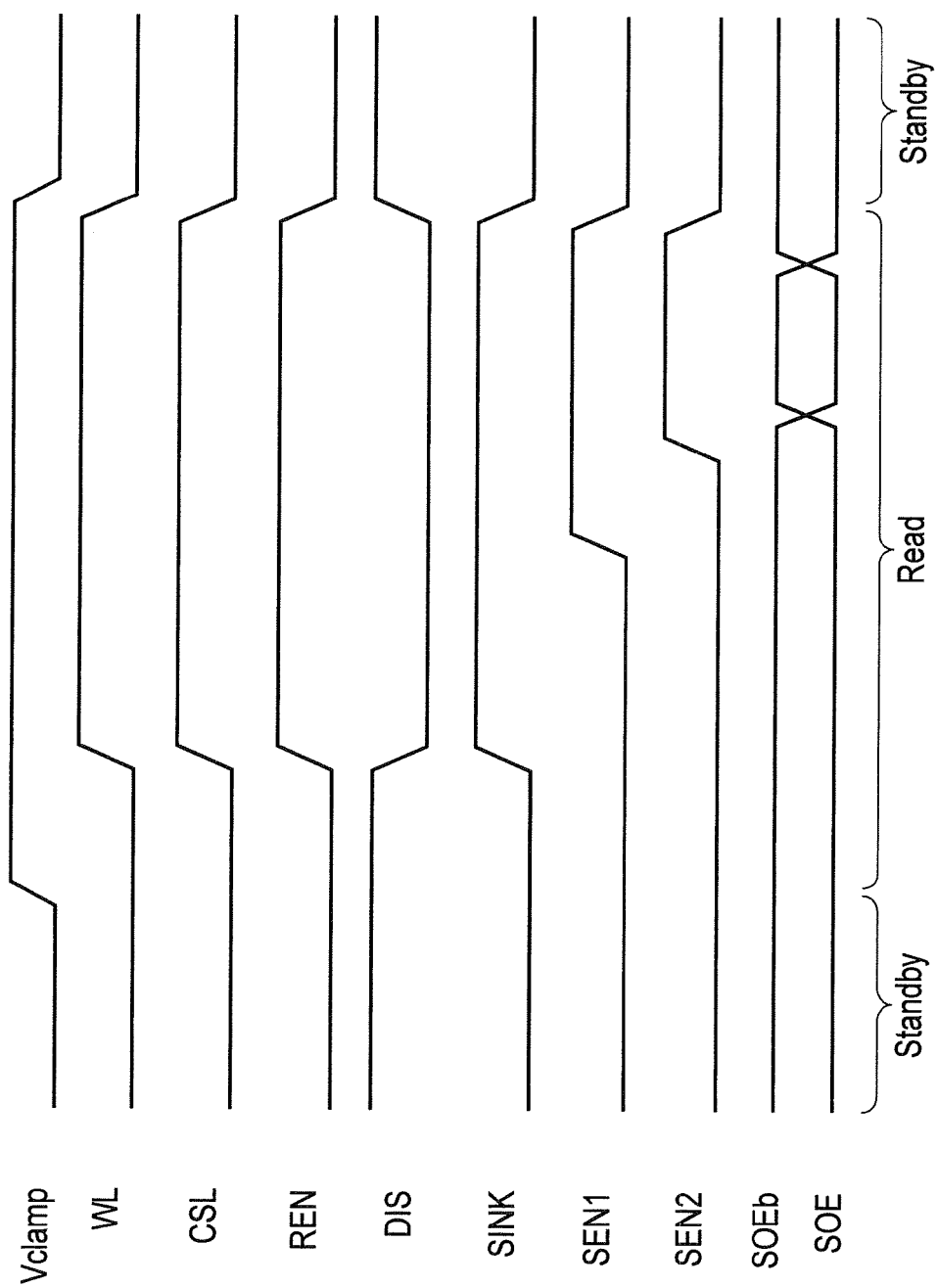
FIG. 7 is a timing chart of each signal during standby or when reading in the resistance change memory according to a second embodiment.

FIG. 7 is a timing chart of each signal during standby or when reading in the resistance change memory according to the second embodiment.

Each signal in the standby state before reading is started and the operation thereof are as follows.

A read enable signal REN is "Low" and the read enable transistors M5, M7 are thereby in an off state. An analog voltage Vclamp supplied from a voltage generating circuit 16 is "Low" and the clamp transistor M4 is thereby in an off state. A sense enable signal SEN1 is "Low" and a node SO and a node SOb are thereby precharged at a power supply voltage VDD. Further, a discharge signal DIS is "High" and discharge transistors M6, M8 are thereby in an on state.

A word line WL, a column selection signal CSL<n>, a signal SINK, a sense enable signal SEN2, and a signal SOE are "Low" and a signal SOEb is "High". A MOS transistor connected to these signals is thereby in an off state.

Each signal and the operation thereof when reading are as follows.

In a sense amplifier 12, as the initial state, the analog voltage Vclamp (for example, 0.6 V) is supplied to the clamp transistor M4 and the clamp transistor M4 is in an on state.

In a memory cell array 11, the column selection signal CSL<n> becomes "High" and a local bit line LBL<n> and a local source line LSL<n> are selected. Further, a word line WL<n> is driven and a memory cell MC to be read is selected. The discharge signal DIS becomes "Low" and the discharge transistors M6, M8 are turned off. The signal SINK becomes "High" and a sink transistor M3 is turned on. The timing of turning on the sink transistor M3 may be any timing before a read current is passed to the memory cell MC.

In addition, the read enable signal REN becomes "High" and the read enable transistors M5, M7 are turned on. Accordingly, a read current flows from the sense amplifier 12 to the selected memory cell MC.

Next, the sense enable signal SEN1 becomes "High" and sense enable transistors M17, M18 are turned off. Accordingly, precharging of the node SO and the node SOb is stopped. As a result, the read current becomes a current supplied only from the power supply voltage terminal VDD connected to the drains of nMOS transistors M11, M13. At this point, the read current changes in accordance with data ("0" or "1") stored in the selected memory cell MC. That is, the read current changes depending on whether the selected memory cell is in a low-resistance state or a high-resistance state. The read current that changes in accordance with data of the selected memory cell as described above will be written as a cell current IDATA.

Then, the sense enable signal SEN2 becomes "High" and sense enable transistors M15, M16 are turned on. Accordingly, a reference current IREF passed by a reference current generating circuit 17 and the cell current IDATA are compared and "High" or "Low" is held in a latch circuit including pMOS transistors M11, M13 and nMOS transistors M12, M14 in accordance with the comparison result. The reference current IREF is set to an intermediate value between the cell current of a memory cell storing "0" and the cell current of a memory cell storing "1". The reference current IREF is generated by, for example, a reference memory cell.

Lastly, the output enable signal SOE becomes "High" and the output enable signal SOEb becomes "Low" and nMOS transistors M19, M21 and pMOS transistors M20, M22 are turned on. Accordingly, "High" or "Low" held in the latch circuit is output as output signals OUT, OUTb from the nodes SO, SOb respectively.

Each signal in the standby state after reading is completed and the operation thereof are as follows.

The read enable signal REN becomes "Low" and the read enable transistors M5, M7 are thereby in an off state. The analog voltage Vclamp supplied from the voltage generating circuit 16 becomes "Low" and the clamp transistor M4 is thereby in an off state. The sense enable signal SEN1 becomes "Low" and the node SO and the node SOb are thereby precharged at the power supply voltage VDD. The discharge signal DIS becomes "High" and the discharge transistors M6, M8 are thereby in an on state.

The word line WL, the column selection signal CSL<n>, the signal SINK, the sense enable signal SEN2, and the signal SOE become "Low" and the signal SOEb becomes "High". A MOS transistor connected to these signals is thereby in an off state.

In the second embodiment, as shown in FIG. 7, the read enable signal REN becomes "Low" during standby and the nMOS transistors M5, M7 thereby change to an off state. Further, the analog voltage Vclamp becomes "Low" and the clamp transistor M4 thereby changes to an off state. Accordingly, in the sense amplifier 12, at least two transistors in an off state that interrupt a current can be arranged in series on a leak path between the power supply voltage terminal VDD and the ground potential terminal Vss. As a result, a leak current during standby can be decreased.

That a leak current during standby can be decreased will be described in detail using FIG. 8. FIG. 8 is a circuit diagram showing the states of transistors during standby of the resistance change memory according to the second embodiment. Transistors in an off state are indicated by an X mark of a broken line.

The sense enable signal SEN1 is "Low" during standby. Accordingly, the node SO and the node SOb are precharged at the power supply voltage VDD and the output signals OUT, OUTb are both held at "High".

In this case, the read enable transistor M5 and the clamp transistor M4 are in an off state on a leak path 2 formed in the order of the power supply voltage terminal VDD, the sense enable transistor M17, the nMOS transistor M12, the read enable transistor M5, the clamp transistor M4, the discharge transistor M6, and the ground potential terminal Vss. Thus, two MOS transistors in an off state are present on the leak path 2.

Thus, at least two transistors in an off state can be arranged on the leak path 2 between the power supply voltage terminal VDD and the ground potential terminal Vss during standby. A leak current can thereby be decreased.

In the second embodiment, as described above, at least two transistors in an off state can be arranged, as shown in FIG. 8, on the leak path between the power supply voltage terminal VDD and the ground potential terminal Vss by using a standby and read sequence shown in FIG. 7. Accordingly, a leak current during standby can be decreased and power consumption can thereby be reduced.

[Third Embodiment]

In the third embodiment, an example combining signal control in the first and second embodiments, that is, an example in which sense enable transistors M17, M18, a read enable transistor M5, and a clamp transistor M4 are made to be in an off state during standby will be described. The configuration of a resistance change memory, a memory cell array, and the configuration of a sense amplifier in the third embodiment are the same as those in the first embodiment shown in FIGS. 1 and 2 and thus, the description thereof is omitted.

Figure 9:
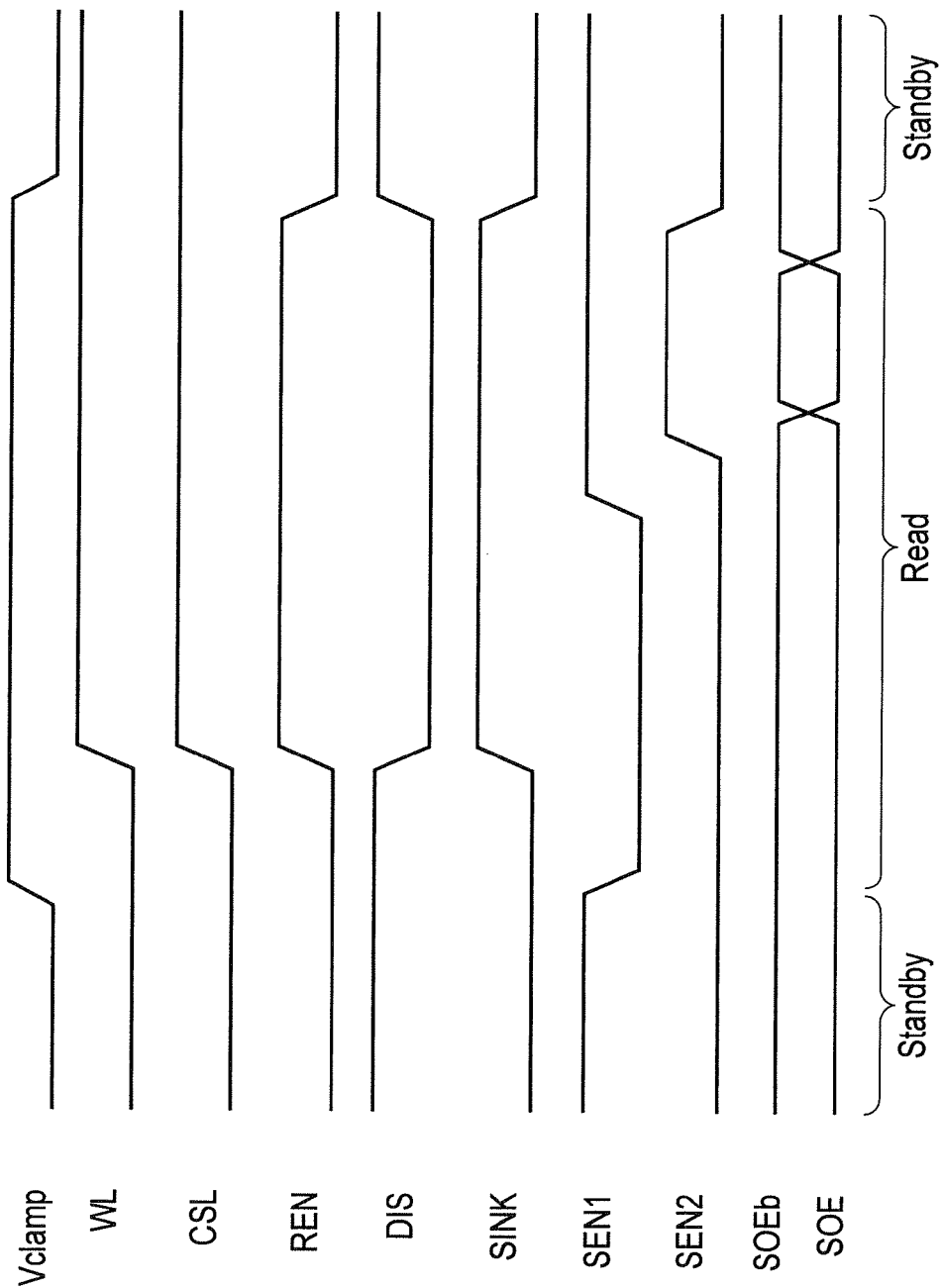
FIG. 9 is a timing chart of each signal during standby or when reading in the resistance change memory according to a third embodiment.

FIG. 9 is a timing chart of each signal during standby or when reading in the resistance change memory according to the third embodiment.

Each signal in the standby state before reading is started and the operation thereof are as follows.

A read enable signal REN is "Low" and the read enable transistors M5, M7 are thereby in an off state. A sense enable signal SEN1 is "High" and the sense enable transistors M17, M18 are thereby in an off state. An analog voltage Vclamp is "Low" and the clamp transistor M4 is thereby in an off state. A discharge signal DIS is "High" and discharge transistors M6, M8 are thereby in an on state.

A word line WL, a column selection signal CSL<n>, a signal SINK, a sense enable signal SEN2, and a signal SOE are "Low" and a signal SOEb is "High". A MOS transistor connected to these signals is thereby in an off state.

Each signal and the operation thereof when reading are as follows.

In a sense amplifier 12, the sense enable signal SEN1 becomes "Low" as the initial state and a node SO and a node SOb are precharged at a power supply voltage VDD. The analog voltage Vclamp (for example, 0.6 V) is supplied to the clamp transistor M4 and the clamp transistor M4 is in an on state.

In a memory cell array 11, the column selection signal CSL<n> becomes "High" and a local bit line LBL<n> and a local source line LSL<n> are selected. Further, a word line WL<n> is driven and a memory cell MC to be read is selected. The discharge signal DIS becomes "Low" and the discharge transistors M6, M8 are turned off. The signal SINK becomes "High" and a sink transistor M3 is turned on. The timing of turning on the sink transistor M3 may be any timing before a read current is passed to the memory cell MC.

In addition, the read enable signal REN becomes "High" and the read enable transistors M5, M7 are turned on. Accordingly, a read current flows from the sense amplifier 12 to the selected memory cell MC.

Next, the sense enable signal SEN1 becomes "High" and the sense enable transistors M17, M18 are turned off. Accordingly, precharging of the node SO and the node SOb is stopped. As a result, the read current becomes a current supplied only from the power supply voltage terminal VDD connected to the drains of nMOS transistors M11, M13. At this point, the read current changes in accordance with data ("0" or "1") stored in the selected memory cell MC. That is, the read current (cell current IDATA) changes depending on whether the selected memory cell is in a low-resistance state or a high-resistance state.

Then, the sense enable signal SEN2 becomes "High" and sense enable transistors M15, M16 are turned on. Accordingly, a reference current IREF passed by a reference current generating circuit 17 and the cell current IDATA are compared and "High" or "Low" is held in a latch circuit including pMOS transistors M11, M13 and nMOS transistors M12, M14 in accordance with the comparison result.

Lastly, the output enable signal SOE becomes "High" and the output enable signal SOEb becomes "Low" and nMOS transistors M19, M21 and pMOS transistors M20, M22 are turned on. Accordingly, "High" or "Low" held in the latch circuit is output as output signals OUT, OUTb from the nodes SO, SOb respectively.

Each signal in the standby state after reading is completed and the operation thereof are as follows.

The read enable signal REN becomes "Low" and the read enable transistors M5, M7 are thereby in an off state. The sense enable signal SEN1 is maintained at "High" and the sense enable transistors M17, M18 are thereby in an off state. An analog voltage Vclamp becomes "Low" and the clamp transistor M4 is thereby in an off state. The discharge signal DIS becomes "High" and the discharge transistors M6, M8 are thereby in an on state.

The word line WL, the column selection signal CSL<n>, the signal SINK, the sense enable signal SEN2, and the signal SOE become "Low" and the signal SOEb becomes "High". A MOS transistor connected to these signals is thereby in an off state.

In the third embodiment, as shown in FIG. 9, the read enable signal REN becomes "Low" during standby and the nMOS transistors M5, M7 thereby change to an off state. The sense enable signal SEN1 becomes "High" and the pMOS transistors M17, M18 thereby change to an off state. Further, the analog voltage Vclamp becomes "Low" and the clamp transistor M4 thereby changes to an off state. Accordingly, in the sense amplifier 12, at least two transistors in an off state that interrupt a current can be arranged in series on a leak path between the power supply voltage terminal VDD and the ground potential terminal Vss. As a result, a leak current during standby can be decreased.

Figure 10:
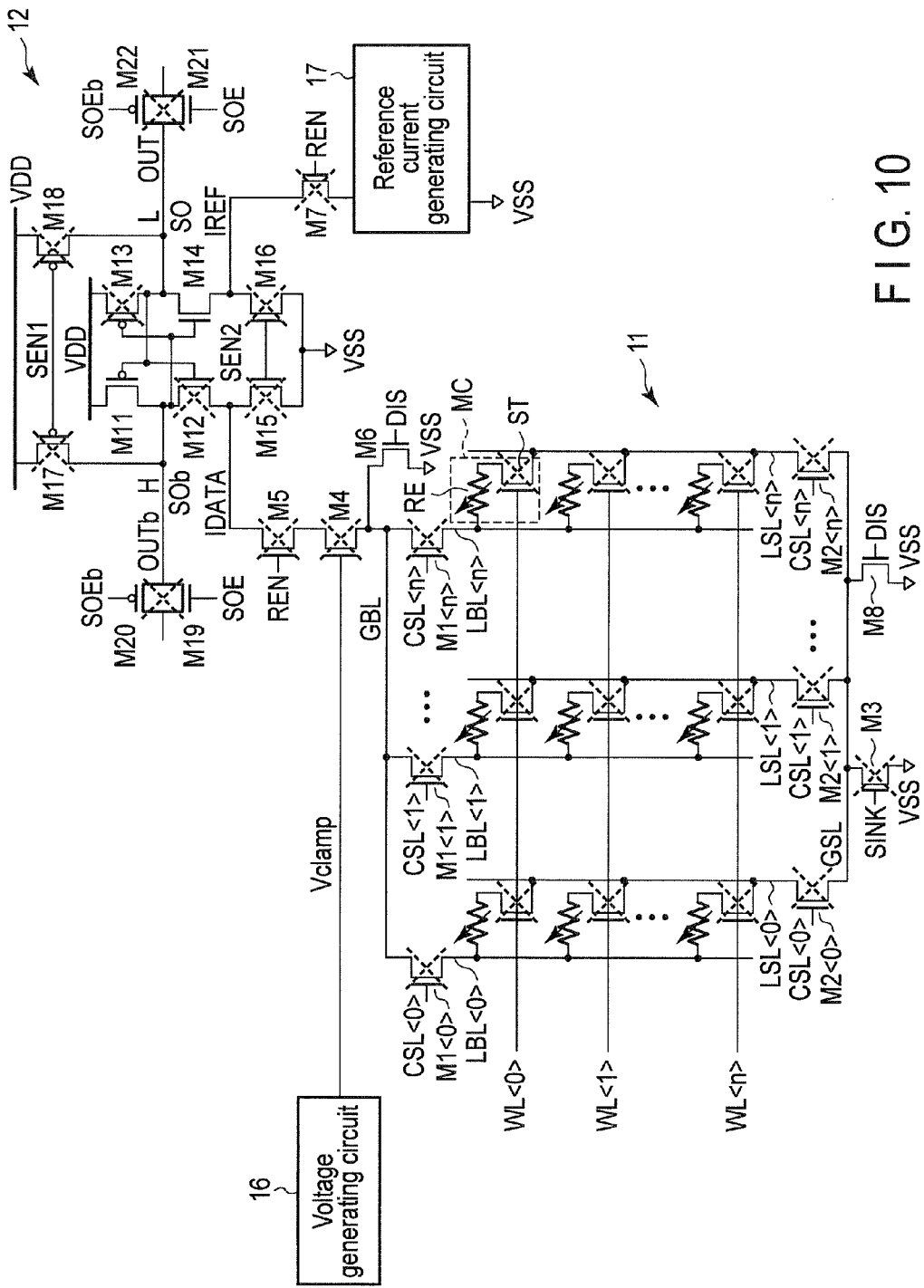
FIGS. 10 and 11 are circuit diagrams showing the states of transistors during standby of the resistance change memory according to the third embodiment.
Figure 11:
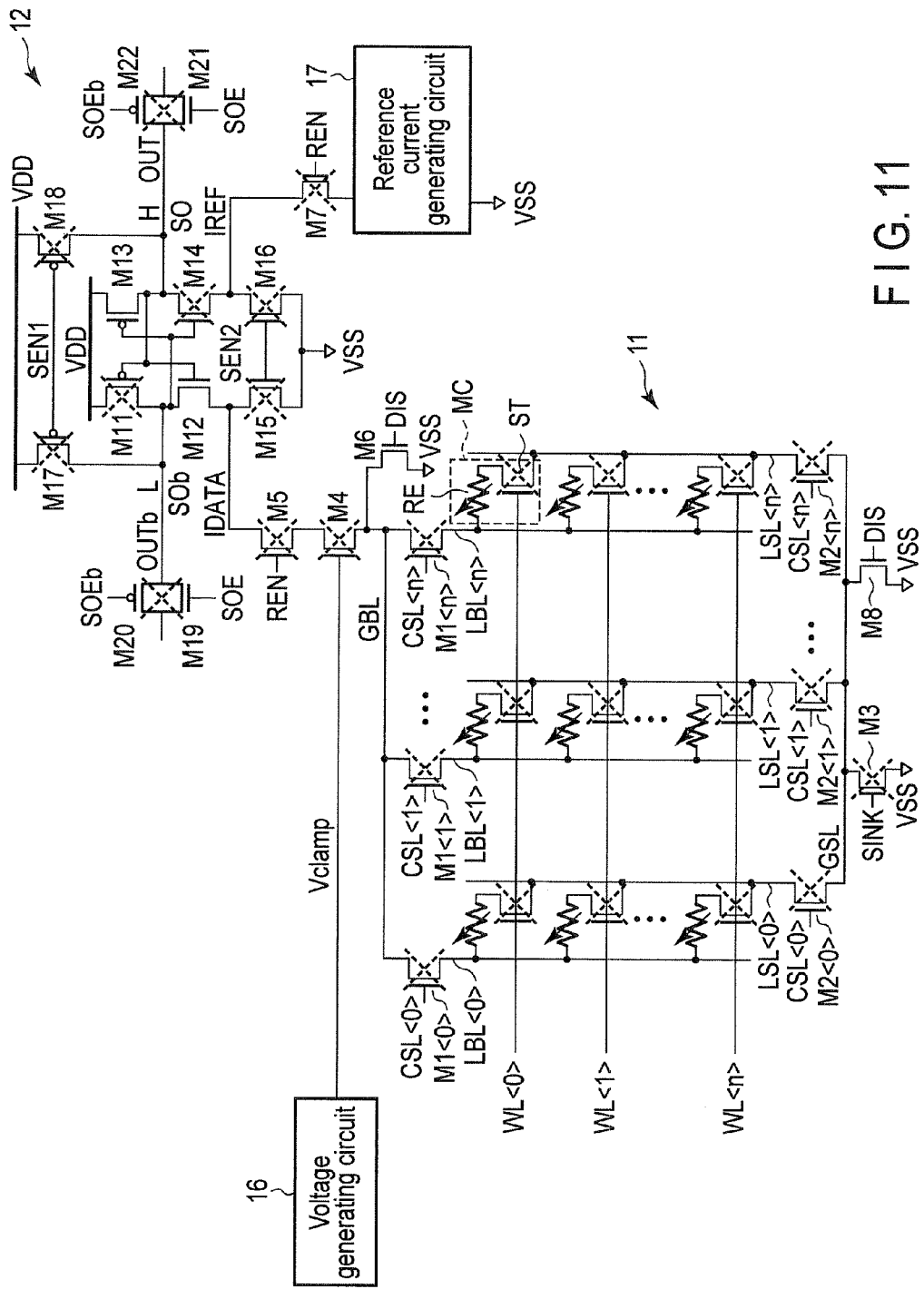

That a leak current during standby can be decreased will be described in detail using FIGS. 10 and 11. FIGS. 10 and 11 are circuit diagrams showing the states of transistors during standby of the resistance change memory according to the third embodiment. Transistors in an off state are indicated by an X mark of a broken line.

If data of the memory cell read in reading before the transition to the standby state is "1", as shown in FIG. 10, the output signal OUTb is held at "High" and the output signal OUT is held at "Low".

In this case, the sense enable transistor M17, the nMOS transistor M12, and the sense enable transistor M15 are in an off state on the leak path 1. Thus, three MOS transistors in an off state are present on the leak path 1.

The sense enable transistor M17, the nMOS transistor M12, the read enable transistor M5, and the clamp transistor M4 are in an off state on the leak path 2. Thus, four MOS transistors in an off state are present on the leak path 2.

In this case, the sense enable transistors M18, M16 are in an off state on the leak path 3. Thus, two MOS transistors in an off state are present on the leak path 3.

The sense enable transistor M18 and the read enable transistor M7 are in an off state on the leak path 4. Thus, two MOS transistors in an off state are present on the leak path 4.

Thus, even if read data before the transition to the standby state is "1", at least two transistors in an off state can be arranged on a leak path between the power supply voltage terminal VDD and the ground potential terminal Vss during standby after the transition. A leak current can thereby be decreased.

If data of the memory cell read in reading before the transition to the standby state is "0", as shown in FIG. 11, the output signal OUTb is held at "Low" and the output signal OUT is held at "High".

In this case, the sense enable transistors M17, M15 are in an off state on the leak path 1. Thus, two MOS transistors in an off state are present on the leak path 1.

The sense enable transistor M17, the read enable transistor M5, and the clamp transistor M4 are in an off state on the leak path 2. Thus, three MOS transistors in an off state are present on the leak path 2.

The sense enable transistor M18, the nMOS transistor M14, and the sense enable transistor M16 are in an off state on the leak path 3. Thus, three MOS transistors in an off state are present on the leak path 3.

The sense enable transistor M18, the nMOS transistor M14, and the read enable transistor M7 are in an off state on the leak path 4. Thus, three MOS transistors in an off state are present on the leak path 4.

Thus, even if read data before the transition to the standby state is "0", at least two transistors in an off state can be arranged on a leak path between the power supply voltage terminal VDD and the ground potential terminal Vss during standby after the transition. A leak current can thereby be decreased.

In the third embodiment, as described above, at least two transistors in an off state can be arranged, as shown in FIGS. 10 and 11, on a leak path between the power supply voltage terminal VDD and the ground potential terminal Vss by using a standby and read sequence shown in FIG. 9. Accordingly, a leak current during standby can be decreased and power consumption can thereby be reduced.

[Fourth Embodiment]

While a resistance change memory including a current detection type sense amplifier has been shown in the first to third embodiment, a resistance change memory including a voltage detection type sense amplifier will be described in the fourth embodiment. In the fourth embodiment, like in the first embodiment, sense enable transistors M17, M18 and a read enable transistor M5 are made to be in an off state during standby. The configuration of a resistance change memory in the fourth embodiment is the same as that in the first embodiment shown in FIG. 1 in the basic configuration and thus, the description thereof is omitted.

Figure 12:
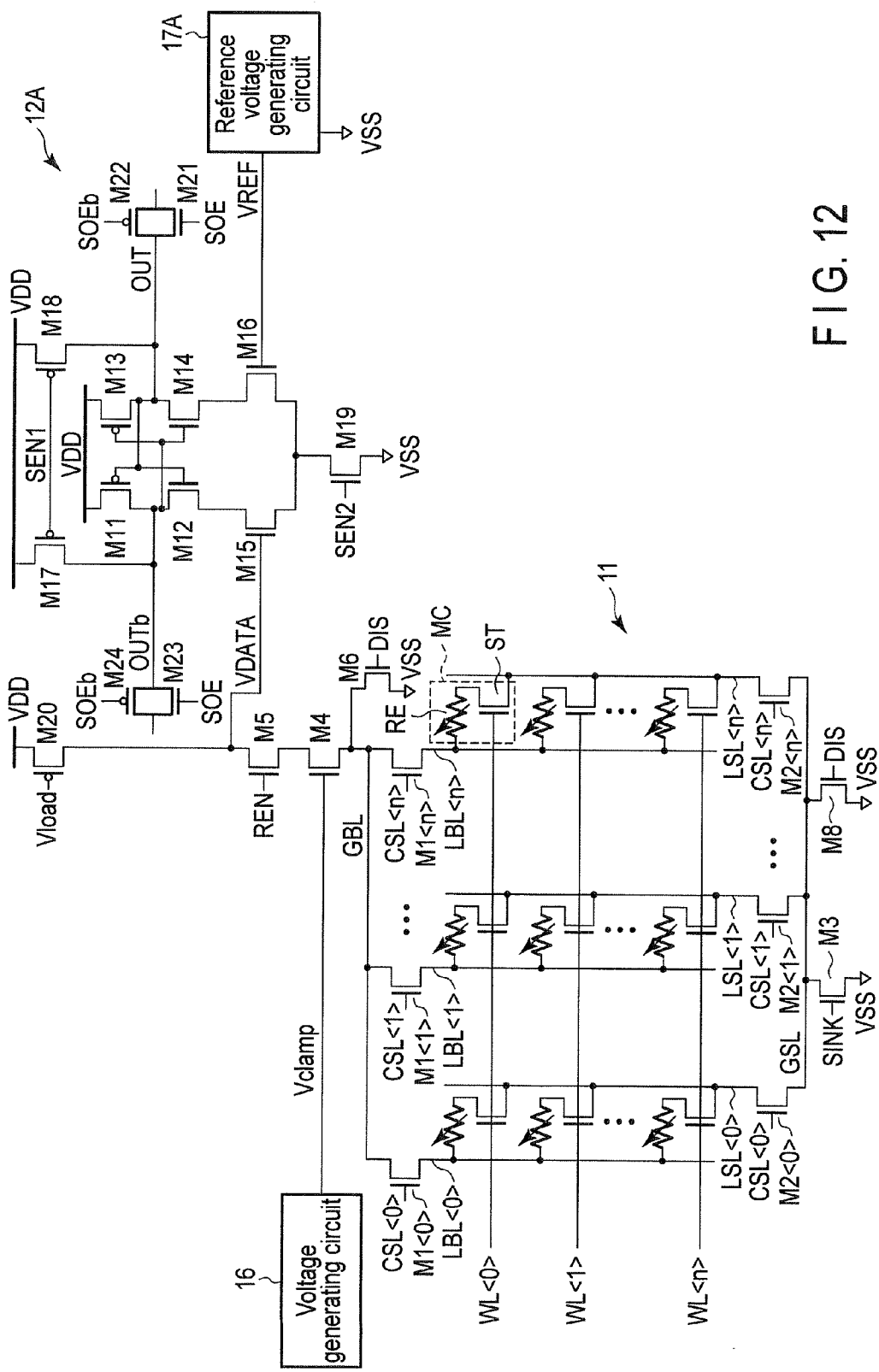
FIG. 12 is a circuit diagram showing the configuration of principal components of the resistance change memory according to a fourth embodiment.

FIG. 12 is a circuit diagram showing the configuration of a memory cell array 11, a voltage detection type sense amplifier 12A, a voltage generating circuit 16, and a reference voltage generating circuit 17A in the fourth embodiment.

The configuration of the memory cell array 11 will be described.

A global bit line GBL is connected to the gate of an nMOS transistor M15 in the sense amplifier 12A via a clamp transistor M4 and a read enable transistor M5 whose current paths are connected in series. The other configuration is the same as that of the memory cell array shown in FIG. 2.

The configuration of the sense amplifier 12A will be described below.

The sense amplifier 12A is a voltage detection type sense amplifier. The sense amplifier 12A includes a first inverter containing a pMOS transistor M11 and an nMOS transistor M12, a second inverter containing a pMOS transistor M13 and an nMOS transistor M14, a first path transistor, a second path transistor, nMOS transistors M15, M16, M19, and pMOS transistors M17, M18, M20.

The first inverter (transistors M11, M12) has a first input terminal, a first output terminal, and first and second voltage terminals. The second inverter (transistors M13, M14) has a second input terminal, a second output terminal, and third and fourth voltage terminals. The second input terminal is connected to the first output terminal and the second output terminal is connected to the first input terminal.

The first path transistor contains an nMOS transistor M23 and a pMOS transistor M24. The second path transistor contains an nMOS transistor M21 and a pMOS transistor M22.

The drain of a pMOS transistor (sense enable transistor) M17 is connected to the first output terminal of the first inverter and the source of the pMOS transistor M17 is connected to a power supply voltage terminal VDD. The first path transistor (transistors M23, M24) is connected to the first output terminal of the first inverter. Output enable signals SOE, SOEb are supplied from a controller 18 to the gates of the transistors M23, M24 respectively.

The drain of a pMOS transistor (sense enable transistor) M18 is connected to the second output terminal of the second inverter and the source of the pMOS transistor M18 is connected to the power supply voltage terminal VDD. The second path transistor (transistors M21, M22) is also connected to the second output terminal of the second inverter. The output enable signals SOE, SOEb are supplied from the controller 18 to the gates of the transistors M21, M22 respectively. Further, a sense enable signal SEN1 is supplied from the controller 18 to the gates of the nMOS transistors M17, M18.

The drain of the nMOS transistor M15 is connected to the first voltage terminal (source of the transistor M12) of the first inverter. The drain of the nMOS transistor M16 is connected to the third voltage terminal (source of the transistor M14) of the second inverter. The sources of the nMOS transistors M15, M16 are connected to a ground potential terminal Vss via the nMOS transistor (sense enable transistor) M19. A sense enable signal SEN2 is supplied from the controller 18 to the gate of the nMOS transistor M19.

The drain of the nMOS transistor (read enable transistor) M5 is connected to the gate of the nMOS transistor M15. A read enable signal REN is supplied from the controller 18 to the gate of the nMOS transistor M5.

The reference voltage generating circuit 17A is connected to the gate of the nMOS transistor M16. The reference voltage generating circuit 17A supplies a reference voltage VREF to the sense amplifier 12A. The reference voltage VREF is set to an intermediate value between the cell voltage of a memory cell storing "0" and the cell voltage of a memory cell storing "1". The reference voltage VREF is generated by, for example, a reference cell.

Further, the drain of the nMOS transistor M5 is connected to the power supply voltage terminal VDD via the pMOS transistor (load transistor) M20. A load voltage Vload is supplied to the gate of the pMOS transistor M20.

Next, the standby and read in a resistance change memory according to the fourth embodiment will be described. The timing chart of each signal during standby or when reading in the resistance change memory is the same as the chart shown in FIG. 4.

Each signal in the standby state before reading is started and the operation thereof are as follows.

The read enable signal REN is "Low" and the read enable transistor M5 is thereby in an off state. The sense enable signal SEN1 is "High" and the sense enable transistors M17, M18 are thereby in an off state. The load voltage Vload is "Low" and the load transistor M20 is thereby in an on state. Further, a discharge signal DIS is "High" and discharge transistors M6, M8 are thereby in an on state.

A word line WL, a column selection signal CSL<n>, a signal SINK, the sense enable signal SEN2, and the signal SOE are "Low" and the signal SOEb is "High". A MOS transistor connected to these signals is thereby in an off state.

Each signal and the operation thereof when reading are as follows.

In the sense amplifier 12A, the sense enable signal SEN1 becomes "Low" as the initial state and a node SO and a node SOb are precharged at the power supply voltage VDD. An analog voltage Vclamp (for example, 0.6 V) is supplied to the clamp transistor M4 and the clamp transistor M4 is in an on state.

In the memory cell array 11, the column selection signal CSL<n> becomes "High" and a local bit line LBL<n> and a local source line LSL<n> are selected. Further, the word line WL<n> is driven and a memory cell MC to be read is selected. The discharge signal DIS becomes "Low" and the discharge transistors M6, M8 are turned off. The signal SINK becomes "High" and a sink transistor M3 is turned on. The timing of turning on the sink transistor M3 may be any timing before a read current is passed to the memory cell MC.

The read enable signal REN becomes "High" and the read enable transistor M5 is turned on. Accordingly, a read current flows from the sense amplifier 12A to the selected memory cell MC. At this point, the read current changes in accordance with data ("0" or "1") stored in the selected memory cell MC. That is, the read current changes depending on whether the selected memory cell is in a low-resistance state or a high-resistance state and the voltage of a connection node between the nMOS transistor M5 and the pMOS transistor M20. The voltage of the connection node that changes in accordance with data of the selected memory cell as described above will be written as a cell voltage VDATA.

Next, the sense enable signal SEN1 becomes "High" and the sense enable transistors M17, M18 are turned off. Accordingly, precharging of the node SO and the node SOb is stopped. Further, the sense enable signal SEN2 becomes "High" and the sense enable transistor M19 is turned on. Accordingly, the reference voltage VREF passed by the reference voltage generating circuit 17A and the cell voltage VDATA are compared and "High" or "Low" is held in a latch circuit including the pMOS transistors M11, M13 and the nMOS transistors M12, M14 in accordance with the comparison result. Then, "High" or "Low" held in the latch circuit is output as output signals OUT, OUTb from the nodes SO, SOb respectively.

Lastly, the output enable signal SOE becomes "High" and the output enable signal SOEb becomes "Low" and the nMOS transistors M21, M23 and the pMOS transistors M22, M24 are turned on. Accordingly, "High" or "Low" held in the latch circuit is output as the output signals OUT, OUTb from the nodes SO, SOb respectively.

Each signal in the standby state after reading is completed and the operation thereof are as follows.

The read enable signal REN becomes "Low" and the read enable transistor M5 is thereby in an off state. The sense enable signal SEN1 is maintained at "High" and the sense enable transistors M17, M18 are thereby in an off state. The load voltage Vload becomes "Low" and the load transistor M20 is thereby in an on state. Further, the discharge signal DIS becomes "High" and the discharge transistors M6, M8 are thereby in an on state.

The word line WL, the column selection signal CSL<n>, the signal SINK, the sense enable signal SEN2, and the signal SOE are "Low" and the signal SOEb is "High". A MOS transistor connected to these signals is thereby in an off state.

In the fourth embodiment, as shown in FIG. 4, the read enable signal REN becomes "Low" during standby and the nMOS transistor M5 changes thereby to an off state. Further, the sense enable signal SEN1 becomes "High" and the pMOS transistors M17, M18 thereby change to an off state. Accordingly, in the sense amplifier 12A, at least two transistors in an off state that interrupt a current can be arranged in series on a leak path between the power supply voltage terminal VDD and the ground potential terminal Vss. As a result, a leak current during standby can be decreased.

Figure 13:
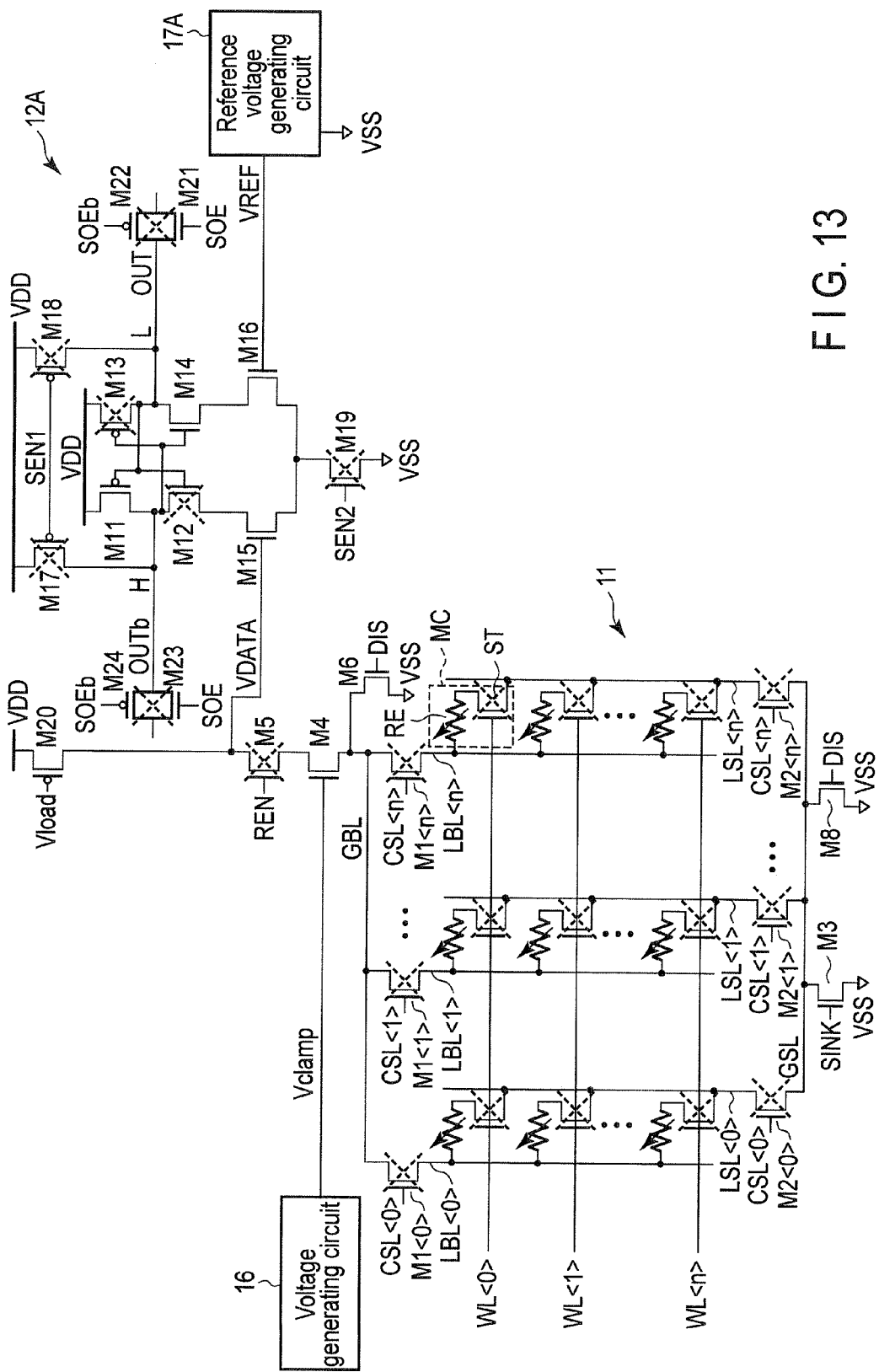
FIGS. 13 and 14 are circuit diagrams showing the states of transistors during standby of the resistance change memory according to the fourth embodiment.
Figure 14:
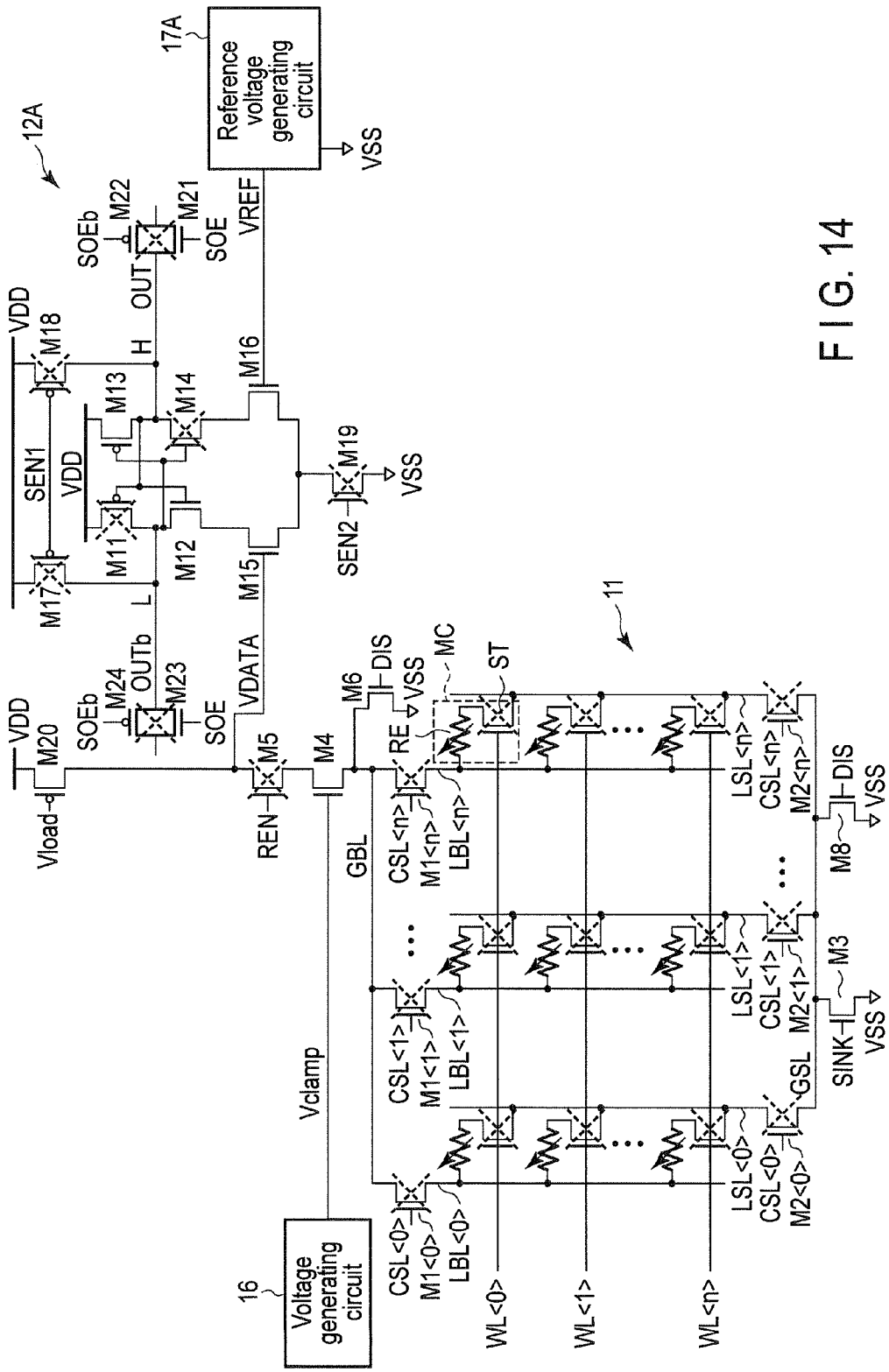

That a leak current during standby can be decreased will be described in detail using FIGS. 13 and 14. FIGS. 13 and 14 are circuit diagrams showing the states of transistors during standby of the resistance change memory according to the fourth embodiment. Transistors in an off state are indicated by an X mark of a broken line.

If data of the memory cell read in reading before the transition to the standby state is "1", as shown in FIG. 13, an output signal OUTb is held at "High" and an output signal OUT is held at "Low".

In this case, the sense enable transistor M17, the nMOS transistor M12, and the sense enable transistor M19 are in an off state on a leak path (hereinafter, written as a leak path 5) formed in the order of the power supply voltage terminal VDD, the sense enable transistor M17, the nMOS transistor M12, the nMOS transistor M15, the sense enable transistor M19, and the ground potential terminal Vss. Thus, three MOS transistors in an off state are present on the leak path 5.

The sense enable transistors M18, M19 are in an off state on a leak path (hereinafter, written as a leak path 6) formed in the order of the power supply voltage terminal VDD, the sense enable transistor M18, the nMOS transistor M14, the nMOS transistor M16, the sense enable transistor M19, and the ground potential terminal Vss. Thus, two MOS transistors in an off state are present on the leak path 6.

Thus, even if read data before the transition to the standby state is "1", at least two transistors in an off state can be arranged on the leak paths 5, 6 between the power supply voltage terminal VDD and the ground potential terminal Vss during standby after the transition. A leak current can thereby be decreased.

If data of the memory cell read in reading before the transition to the standby state is "0", as shown in FIG. 14, the output signal OUTb is held at "Low" and the output signal OUT is held at "High".

In this case, the sense enable transistors M17, M19 are in an off state on the leak path 5. Thus, two MOS transistors in an off state are present on the leak path 5.

The sense enable transistor M18, the nMOS transistor M14, and the sense enable transistor M19 are in an off state on the leak path 6. Thus, three MOS transistors in an off state are present on the leak path 6.

Thus, even if read data before the transition to the standby state is "0", at least two transistors in an off state can be arranged on the leak paths 5, 6 between the power supply voltage terminal VDD and the ground potential terminal Vss during standby after the transition. A leak current can thereby be decreased.

In the fourth embodiment, as described above, at least two transistors in an off state can be arranged, as shown in FIGS. 13 and 14, on a leak path between the power supply voltage terminal VDD and the ground potential terminal Vss by using a standby and read sequence shown in FIG. 4. Accordingly, a leak current during standby can be decreased and power consumption can thereby be reduced.

[Fifth Embodiment]

The fifth embodiment includes a voltage detection type sense amplifier and describes an example in which a clamp transistor M4 and a read enable transistor M5 are made to be in an off state during standby. The configuration of a resistance change memory, a memory cell array, and the configuration of a sense amplifier in the fifth embodiment are the same as those in the fourth embodiment and thus, the description thereof is omitted.

The timing chart of each signal during standby or when reading in the resistance change memory in the fifth embodiment is the same as the chart shown in FIG. 7.

Each signal in the standby state before reading is started and the operation thereof are as follows.

A read enable signal REN is "Low" and the read enable transistor M5 is thereby in an off state. An analog voltage Vclamp is "Low" and the clamp transistor M4 is thereby in an off state. A sense enable signal SEN1 is "Low" and a node SO and a node SOb are thereby precharged at a power supply voltage VDD. Further, a discharge signal DIS is "High" and discharge transistors M6, M8 are thereby in an on state.

A word line WL, a column selection signal CSL<n>, a signal SINK, a sense enable signal SEN2, and a signal SOE are "Low" and a signal SOEb is "High". A MOS transistor connected to these signals is thereby in an off state.

Each signal and the operation thereof when reading are as follows.

In a sense amplifier 12A, as the initial state, the analog voltage Vclamp (for example, 0.6 V) is supplied to the clamp transistor M4 and the clamp transistor M4 is turned on. A load voltage Vload is "Low" and a load transistor M20 is thereby in an on state. Thereafter, each signal and the operation thereof are the same as those in the fourth embodiment and thus, the description thereof is omitted.

Each signal in the standby state after reading is completed and the operation thereof are as follows.

The read enable signal REN becomes "Low" and the read enable transistor M5 is thereby in an off state. The analog voltage Vclamp becomes "Low" and the clamp transistor M4 is thereby in an off state. The sense enable signal SEN1 becomes "Low" and the node SO and the node SOb are thereby precharged at the power supply voltage VDD. The discharge signal DIS becomes "High" and the discharge transistors M6, M8 are thereby in an on state.

The word line WL, the column selection signal CSL<n>, the signal SINK, the sense enable signal SEN2, and the signal SOE become "Low" and the signal SOEb becomes "High". A MOS transistor connected to these signals is thereby in an off state.

In the fifth embodiment, as shown in FIG. 7, the read enable signal REN becomes "Low" during standby and the nMOS transistor M5 changes thereby to an off state. Further, the analog voltage Vclamp becomes "Low" and the clamp transistor M4 thereby changes to an off state. Accordingly, in the sense amplifier 12A, at least two transistors in an off state that interrupt a current can be arranged in series on a leak path between the power supply voltage terminal VDD and a ground potential terminal Vss. As a result, a leak current during standby can be decreased.

That a leak current during standby can be decreased will be described in detail using FIG. 15. FIG. 15 is a circuit diagram showing the states of transistors during standby of the resistance change memory according to the fifth embodiment. Transistors in an off state are indicated by an X mark of a broken line.

During standby, the read enable transistor M5 and the clamp transistor M4 are in an off state on a leak path (hereinafter, written as a leak path 7) formed in the order of the power supply voltage terminal VDD, the load transistor M20, the read enable transistor M5, the clamp transistor M4, the discharge transistor M6, and the ground potential terminal Vss. Thus, two MOS transistors in an off state are present on the leak path 7.

Thus, at least two transistors in an off state can be arranged on the leak path 7 between the power supply voltage terminal VDD and the ground potential terminal Vss during standby. A leak current can thereby be decreased.

In the fifth embodiment, as described above, at least two transistors in an off state can be arranged, as shown in FIG. 15, on a leak path between the power supply voltage terminal VDD and the ground potential terminal Vss by using a standby and read sequence shown in FIG. 7. Accordingly, a leak current during standby can be decreased and power consumption can thereby be reduced.

[Sixth Embodiment]

The sixth embodiment includes a voltage detection type sense amplifier and describes an example in which a load transistor M20 and a read enable transistor M5 are made to be in an off state during standby. The configuration of a resistance change memory, a memory cell array, and the configuration of a sense amplifier in the sixth embodiment are the same as those in the fourth embodiment and thus, the description thereof is omitted.

Figure 16:
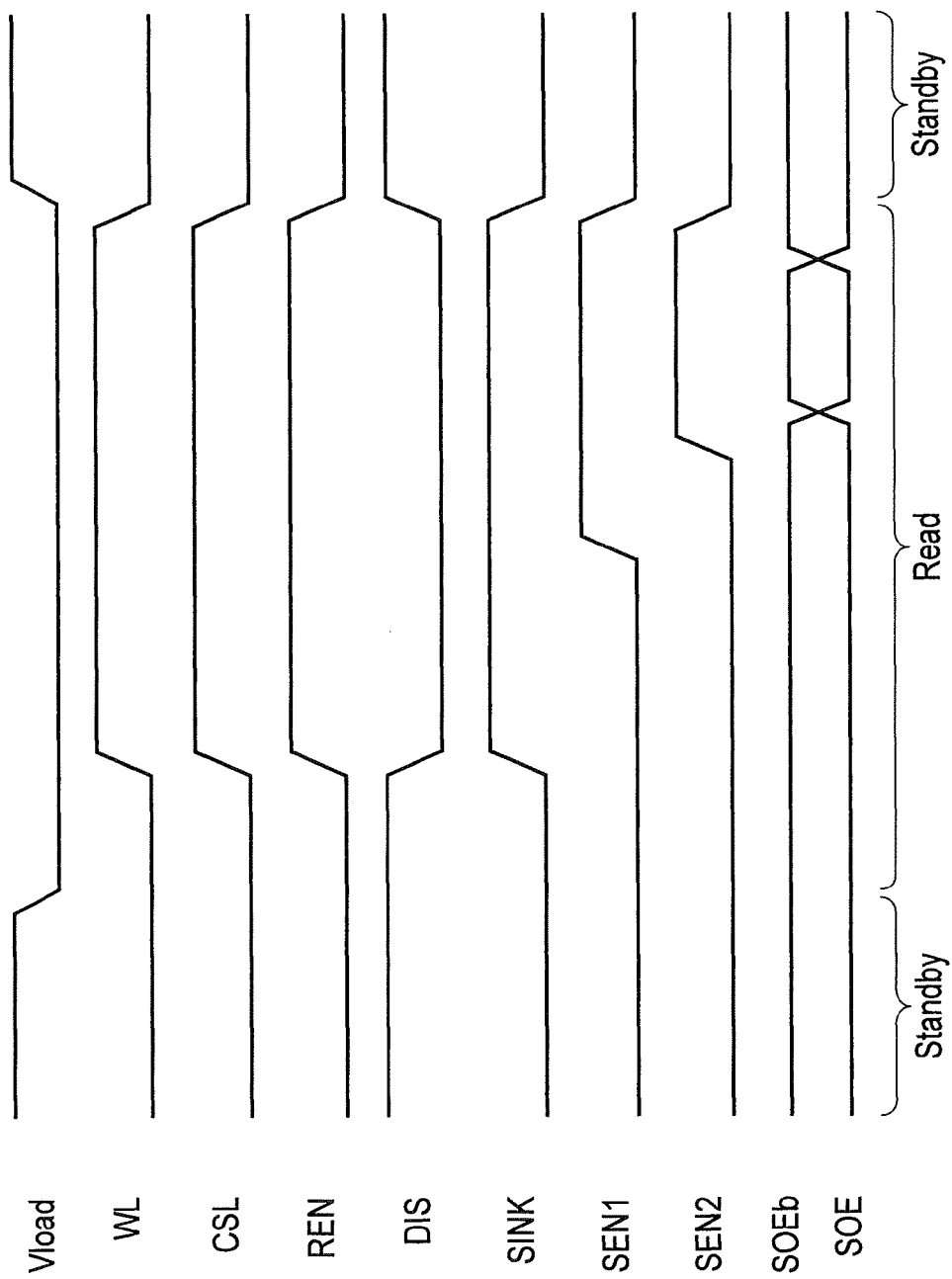
FIG. 16 is a timing chart of each signal during standby or when reading in the resistance change memory according to a sixth embodiment.

FIG. 16 is a timing chart of each signal during standby or when reading in the resistance change memory according to the sixth embodiment.

Each signal in the standby state before reading is started and the operation thereof are as follows.

A read enable signal REN is "Low" and the read enable transistor M5 is thereby in an off state. A load voltage Vload is "High" and the load transistor M20 is thereby in an off state. A sense enable signal SEN1 is "Low" and a node SO and a node SOb are thereby precharged at a power supply voltage VDD. Further, a discharge signal DIS is "High" and discharge transistors M6, M8 are thereby in an on state.

A word line WL, a column selection signal CSL<n>, a signal SINK, a sense enable signal SEN2, and a signal SOE are "Low" and a signal SOEb is "High". A MOS transistor connected to these signals is thereby in an off state.

Each signal and the operation thereof when reading are as follows.

In a sense amplifier 12A, the load voltage Vload becomes "Low" as the initial state and the load transistor M20 is turned on. An analog voltage Vclamp (for example, 0.6 V) is supplied to a clamp transistor M4 and the clamp transistor M4 is in an on state. Thereafter, each signal and the operation thereof are the same as those in the fourth embodiment and thus, the description thereof is omitted.

Each signal in the standby state after reading is completed and the operation thereof are as follows.

The read enable signal REN becomes "Low" and the read enable transistor M5 is thereby in an off state. The load voltage Vload becomes "High" and the load transistor M20 is thereby in an off state. The sense enable signal SEN1 becomes "Low" and the node SO and the node SOb are thereby precharged at the power supply voltage VDD. Further, the discharge signal DIS becomes "High" and the discharge transistors M6, M8 are thereby in an on state.

The word line WL, the column selection signal CSL<n>, the signal SINK, the sense enable signal SEN2, and the signal SOE become "Low" and the signal SOEb becomes "High". A MOS transistor connected to these signals is thereby in an off state.

In the sixth embodiment, as shown in FIG. 16, the read enable signal REN becomes "Low" during standby and the nMOS transistor M5 changes thereby to an off state. Further, the load voltage Vload becomes "High" and the load transistor M20 thereby changes to an off state. Accordingly, in the sense amplifier 12A, at least two transistors in an off state that interrupt a current can be arranged in series on a leak path between the power supply voltage terminal VDD and the ground potential terminal Vss. As a result, a leak current during standby can be decreased.

Figure 17:
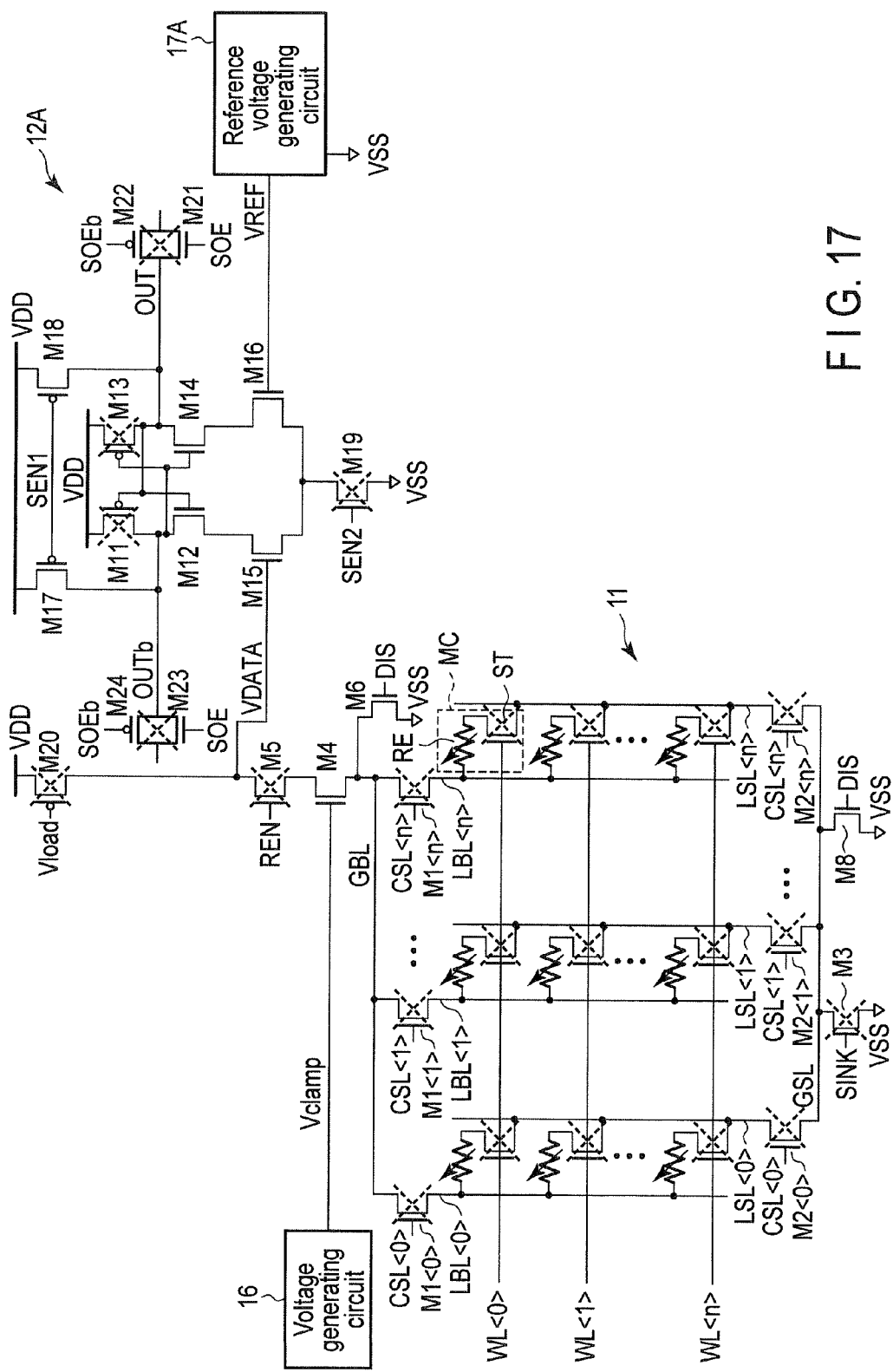
FIG. 17 is a circuit diagram showing the states of transistors during standby of the resistance change memory according to the sixth embodiment.

That a leak current during standby can be decreased will be described in detail using FIG. 17. FIG. 17 is a circuit diagram showing the states of transistors during standby of the resistance change memory according to the sixth embodiment. Transistors in an off state are indicated by an X mark of a broken line.

During standby, the load transistor M20 and the read enable transistor M5 are in an off state on the leak path 7 formed in the order of the power supply voltage terminal VDD, the load transistor M20, the read enable transistor M5, the clamp transistor M4, the discharge transistor M6, and the ground potential terminal Vss. Thus, two MOS transistors in an off state are present on the leak path 7.

Thus, at least two transistors in an off state can be arranged on the leak path 7 between the power supply voltage terminal VDD and the ground potential terminal Vss during standby. A leak current can thereby be decreased.

In the sixth embodiment, as described above, at least two transistors in an off state can be arranged, as shown in FIG. 17, on a leak path between the power supply voltage terminal VDD and the ground potential terminal Vss by using a standby and read sequence shown in FIG. 16. Accordingly, a leak current during standby can be decreased and power consumption can thereby be reduced.

[Seventh Embodiment]

In the seventh embodiment, an example combining signal control in the fourth and sixth embodiments, that is, an example in which sense enable transistors M17, M18, a read enable transistor M5, a clamp transistor M4, and a load transistor M20 are made to be in an off state during standby will be described. The configuration of a resistance change memory, a memory cell array, and the configuration of a sense amplifier in the seventh embodiment are the same as those in the fourth embodiment and thus, the description thereof is omitted.

Figure 18:
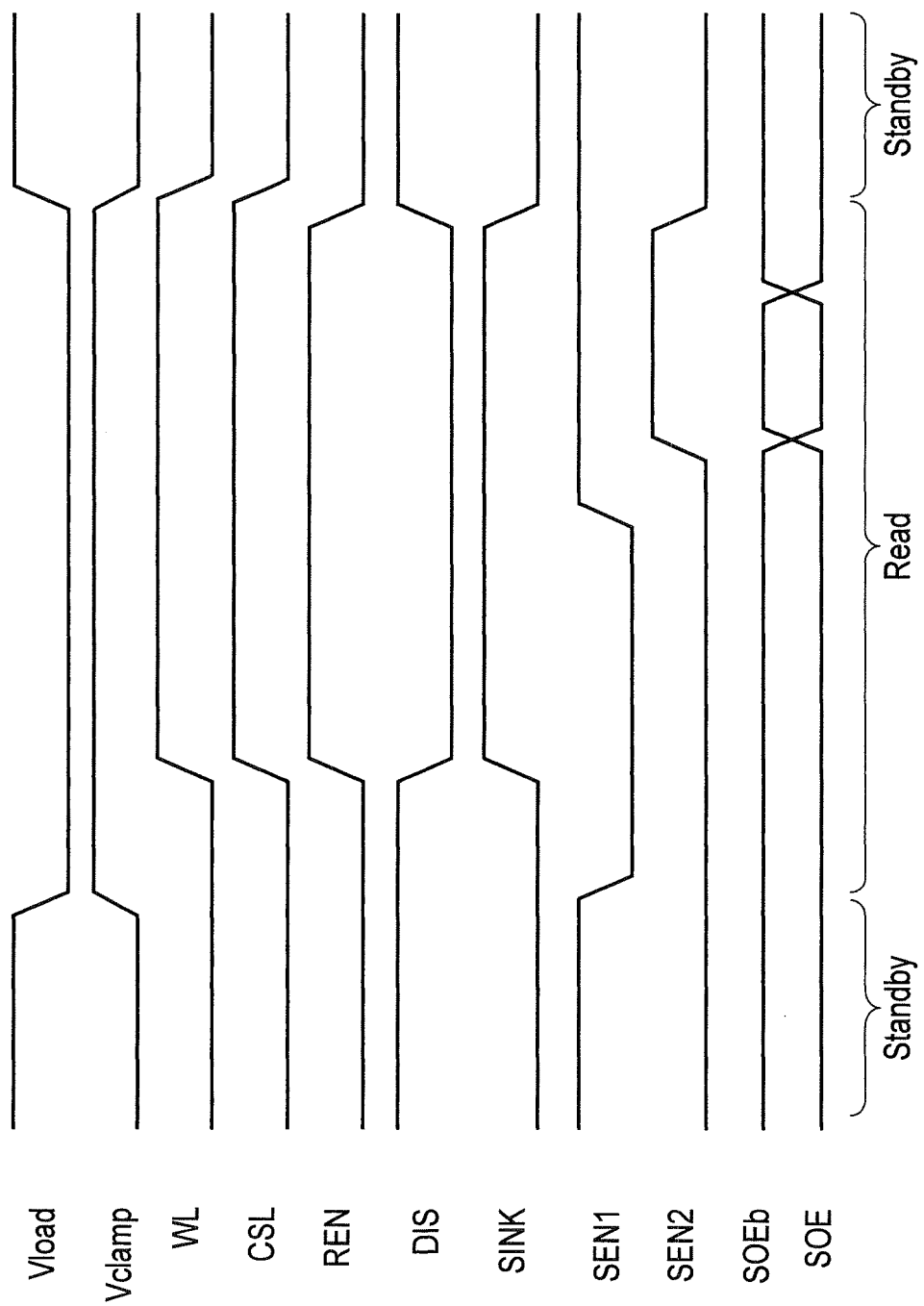
FIG. 18 is a timing chart of each signal during standby or when reading in the resistance change memory according to a seventh embodiment.

FIG. 18 is a timing chart of each signal during standby or when reading in the resistance change memory according to the seventh embodiment.

Each signal in the standby state before reading is started and the operation thereof are as follows.

A read enable signal REN is "Low" and the read enable transistor M5 is thereby in an off state. A sense enable signal SEN1 is "High" and the sense enable transistors M17, M18 are thereby in an off state. An analog voltage Vclamp is "Low" and the clamp transistor M4 is thereby in an off state. A load voltage Vload is "High" and the load transistor M20 is thereby in an off state. Further, a discharge signal DIS is "High" and discharge transistors M6, M8 are thereby in an on state.

A word line WL, a column selection signal CSL<n>, a signal SINK, a sense enable signal SEN2, and a signal SOE are "Low" and a signal SOEb is "High". A MOS transistor connected to these signals is thereby in an off state.

Each signal and the operation thereof when reading are as follows.

In a sense amplifier 12A, the load voltage Vload becomes "Low" as the initial state and the load transistor M20 is turned on. The analog voltage Vclamp (for example, 0.6 V) is supplied to the clamp transistor M4 and the clamp transistor M4 is turned on. Thereafter, each signal and the operation thereof are the same as those in the fourth embodiment and thus, the description thereof is omitted.

Each signal in the standby state after reading is completed and the operation thereof are as follows.

The read enable signal REN becomes "Low" and the read enable transistor M5 is thereby in an off state. The sense enable signal SEN1 is maintained at "High" and the sense enable transistors M17, M18 are thereby in an off state. The load voltage Vload becomes "High" and the load transistor M20 is thereby in an off state. The analog voltage Vclamp becomes "Low" and the clamp transistor M4 is thereby in an off state. Further, the discharge signal DIS becomes "High" and the discharge transistors M6, M8 are thereby in an on state.

The word line WL, the column selection signal CSL<n>, the signal SINK, the sense enable signal SEN2, and the signal SOE become "Low" and the signal SOEb becomes "High". A MOS transistor connected to these signals is thereby in an off state.

In the seventh embodiment, as shown in FIG. 18, the read enable signal REN becomes "Low" during standby and the nMOS transistor M5 changes thereby to an off state. Further, the sense enable signal SEN1 becomes "High" and the pMOS transistors M17, M18 thereby change to an off state. The analog voltage Vclamp becomes "Low" and the clamp transistor M4 thereby changes to an off state. Further, the load voltage Vload becomes "High" and the load transistor M20 thereby changes to an off state. Accordingly, in the sense amplifier 12A, at least two transistors in an off state that interrupt a current can be arranged in series on a leak path between the power supply voltage terminal VDD and the ground potential terminal Vss. As a result, a leak current during standby can be decreased.

Figure 19:
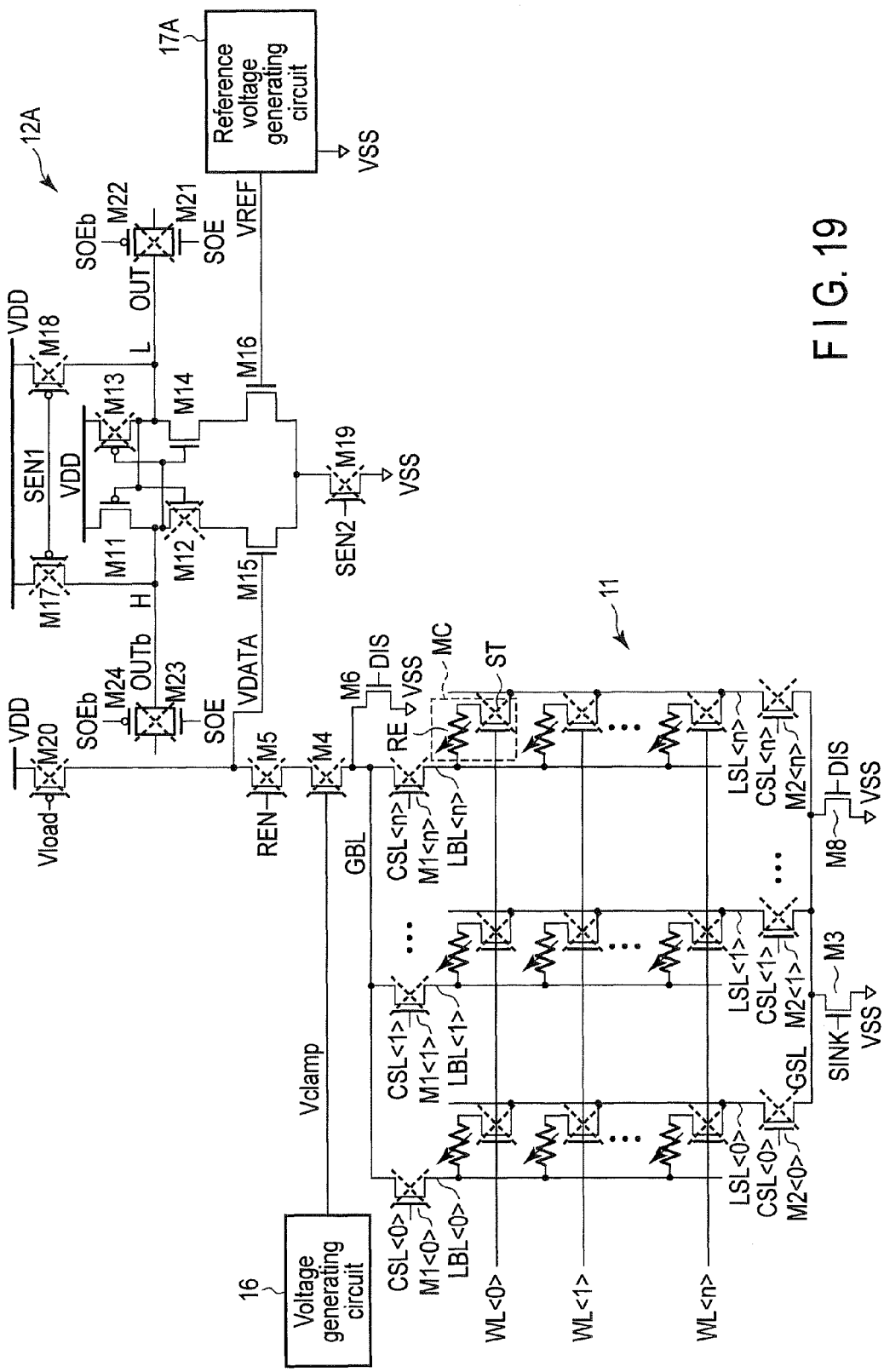

That a leak current during standby can be decreased will be described in detail using FIGS. 19 and 20. FIGS. 19 and 20 are circuit diagrams showing the states of transistors during standby of the resistance change memory according to the seventh embodiment. Transistors in an off state are indicated by an X mark of a broken line.

If data of the memory cell read in reading before the transition to the standby state is "1", as shown in FIG. 19, an output signal OUTb is held at "High" and an output signal OUT is held at "Low".

In this case, the sense enable transistor M17, the nMOS transistor M12, and a sense enable transistor M19 are in an off state on the leak path 5 formed in the order of the power supply voltage terminal VDD, the sense enable transistor M17, the nMOS transistor M12, the nMOS transistor M15, the sense enable transistor M19, and the ground potential terminal Vss. Thus, three MOS transistors in an off state are present on the leak path 5.

The sense enable transistors M18, M19 are in an off state on the leak path 6 formed in the order of the power supply voltage terminal VDD, the sense enable transistor M18, the nMOS transistor M14, the nMOS transistor M16, the sense enable transistor M19, and the ground potential terminal Vss. Thus, two MOS transistors in an off state are present on the leak path 6.

The load transistor M20, the read enable transistor M5, and the clamp transistor M4 are in an off state on the leak path 7 formed in the order of the power supply voltage terminal VDD, the load transistor M20, the read enable transistor M5, the clamp transistor M4, the discharge transistor M6, and the ground potential terminal Vss. Thus, three MOS transistors in an off state are present on the leak path 7.

Thus, even if read data before the transition to the standby state is "1", at least two transistors in an off state can be arranged on a leak path between the power supply voltage terminal VDD and the ground potential terminal Vss during standby after the transition. A leak current can thereby be decreased.

If data of the memory cell read in reading before the transition to the standby state is "0", as shown in FIG. 20, the output signal OUTb is held at "Low" and the output signal OUT is held at "High".

In this case, the sense enable transistors M17, M19 are in an off state on the leak path 5. Thus, two MOS transistors in an off state are present on the leak path 5.

The sense enable transistor M18, the nMOS transistor M14, and the sense enable transistor M19 are in an off state on the leak path 6. Thus, three MOS transistors in an off state are present on the leak path 6.

The load transistor M20, the read enable transistor M5, and the clamp transistor M4 are in an off state on the leak path 7. Thus, three MOS transistors in an off state are present on the leak path 7.

Thus, even if read data before the transition to the standby state is "0", at least two transistors in an off state can be arranged on a leak path between the power supply voltage terminal VDD and the ground potential terminal Vss during standby after the transition. A leak current can thereby be decreased.

In the seventh embodiment, as described above, at least two transistors in an off state can be arranged, as shown in FIGS. 19 and 20, on a leak path between the power supply voltage terminal VDD and the ground potential terminal Vss by using a standby and read sequence shown in FIG. 18. Accordingly, a leak current during standby can be decreased and power consumption can thereby be reduced.

[Effect]

For example, a case in which when a sense amplifier is in a standby state, the read enable signal REN is inactivated ("Low") and the sense enable signal SEN1 that precharges a latch circuit is activated ("Low") will be considered. In this case, a leak current flowing leak path on which only one MOS transistor in an off state is arranged between the power supply voltage terminal VDD and the ground potential terminal Vss is present in the sense amplifier. Thus, a leak current always flows on the leak path during standby. In addition, as many leak paths as the number of sense amplifiers arranged in a chip are present. Thus, a problem of increased power consumption during standby is posed.

In the present embodiment, at least two MOS transistors in an off state are arranged on a leak path between the power supply voltage terminal VDD and the ground potential terminal Vss. Accordingly, a leak current during standby can be decreased and power consumption can thereby be reduced.

The present embodiment can be applied to semiconductor memories that use a current to write such as MRAM that uses a magnetoresistive effect element, ReRAM that uses a variable resistance element, and PRAM that uses a phase change element.

In MRAM, for example, a magnetoresistive element called an MTJ (magnetic tunnel junction) element is used as a storage element. The MTJ element has a fixed layer (or a reference layer) in which the magnetization direction is fixed by an antiferromagnetic layer, a recording layer (or a free layer) in which the magnetization direction can freely be reversed, and a dielectric film sandwiched between the fixed layer and the recording layer. The MTJ element uses the change of resistance due to a relative magnetization direction of the recording layer relative to the fixed layer called the magnetoresistance effect. That is, data of "1" or "0" is determined by using a difference of resistance depending on the relative magnetization direction.

Data is written, as a data writing mechanism in MRAM, as shown below in, for example, a spin injection type MRAM. When writing "1" data, a current is passed from the fixed layer to the recording layer in an MTJ element to write "1". When writing "0" data, on the other hand, a current is passed from the recording layer to the fixed layer in an MTJ element to write "0".

The configuration of an entire resistance change memory in the present embodiment, the memory cell array, memory cell, sense amplifier, driver/sinker, driver, voltage generating circuit, reference current generating circuit, and reference voltage generating circuit is not limited to the above example. For example, the configuration disclosed by U.S. Pat. No. 7,649,792 or U.S. patent application publication No. 2012/0286339 can be used. The entire content of these specifications is incorporated herein by reference.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A resistance change memory comprising:
a first memory cell including a resistance change element;
a word line coupled to the first memory cell;
a first bit line coupled to the first memory cell;
a sense amplifier which reads data from the first memory cell, the sense amplifier including a first inverter, a second inverter, and a first transistor, the first transistor being electrically coupled between each of output terminals of the first and second inverters and a first voltage source, and the first transistor having one of a conduction state and a cutoff state according to a first signal supplied to a gate of the first transistor;
a second transistor electrically coupled between the first bit line and the sense amplifier, the second transistor having one of the conduction state and the cutoff state according to a second signal supplied to a gate of the second transistor;
a third transistor electrically coupled between the second transistor and the sense amplifier, the third transistor having one of the conduction state and the cutoff state according to a third signal supplied to a gate of the third transistor;
a fourth transistor electrically coupled between the word line and the first memory cell, the fourth transistor having one of the conduction state and the cutoff state according to a fourth signal supplied to the word line; and
a fifth transistor,
wherein when one of the second transistor and the fourth transistor has the cutoff state, the first transistor and the third transistor have the cutoff state, and
wherein the fifth transistor has the cutoff state in which a read current of the first memory cell is interrupted.

2. The resistance change memory according to claim 1, wherein a time during which the first transistor has the cutoff state is longer than a time during which the first transistor has the conduction state.

3. The resistance change memory according to claim 1, wherein:
the sense amplifier further comprises a further transistor which controls reading by the sense amplifier; and
when one of the second transistor and the fourth transistor has the cutoff state, the further transistor has the cutoff state.

4. The resistance change memory according to claim 1, further comprising a sixth transistor which controls discharge of voltage of the first bit line,
wherein the sixth transistor discharges voltage of the first bit line.

* * * * *